United States Patent
Chen et al.

(10) Patent No.: US 11,355,400 B2
(45) Date of Patent: Jun. 7, 2022

(54) USING A METAL-CONTAINING LAYER AS AN ETCHING STOP LAYER AND TO PATTERN SOURCE/DRAIN REGIONS OF A FINFET

(71) Applicant: Taiwan Semiconductor Manufacturing Co., Ltd., Hsinchu (TW)

(72) Inventors: Yen-Ting Chen, Hsinchu (TW); Wei-Yang Lee, Taipei (TW); Feng-Cheng Yang, Hsinchu (TW); Yen-Ming Chen, Chu-Pei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 5 days.

(21) Appl. No.: 17/111,978

(22) Filed: Dec. 4, 2020

(65) Prior Publication Data

US 2021/0118744 A1    Apr. 22, 2021

Related U.S. Application Data

(60) Continuation of application No. 16/599,912, filed on Oct. 11, 2019, now Pat. No. 10,861,749, which is a
(Continued)

(51) Int. Cl.
*H01L 29/66* (2006.01)
*H01L 21/8238* (2006.01)
(Continued)

(52) U.S. Cl.
CPC .. *H01L 21/823814* (2013.01); *H01L 21/0217* (2013.01); *H01L 21/02178* (2013.01);
(Continued)

(58) Field of Classification Search
CPC ......... H01L 29/41783; H01L 29/66795; H01L 29/7802; H01L 29/7827; H01L 29/7831; H01L 29/785
(Continued)

(56) References Cited

U.S. PATENT DOCUMENTS 7,425,740 B2  9/2008 Liu et al.
7,667,271 B2  2/2010 Yu et al.
(Continued)

FOREIGN PATENT DOCUMENTS

| CN | 105977159 A | 11/2013 |
| CN | 103383918 A | 9/2016 |
| CN | 106816382 A | 6/2017 |

*Primary Examiner* — Hoai V Pham
(74) *Attorney, Agent, or Firm* — Haynes and Boone, LLP

(57) ABSTRACT

A fin structure of a FinFET device is formed over a substrate. A first layer is formed over the fin structure. A gate layer is formed over the fin structure and over the first layer. The gate layer is patterned into a gate stack that wraps around the fin structure. A second layer is formed over the first layer and over the gate stack. A first etching process is performed to remove portions of the second layer formed over the fin structure, the first layer serves as an etching-stop layer during the first etching process. A second etching process is performed to remove portions of the first layer to expose a portion of the fin structure. A removal of the portions of the first layer does not substantially affect the second layer. A source/drain region is epitaxially grown on the exposed portion of the fin structure.

20 Claims, 31 Drawing Sheets

Related U.S. Application Data division of application No. 15/966,186, filed on Apr. 30, 2018, now Pat. No. 10,453,753.

(60) Provisional application No. 62/552,554, filed on Aug. 31, 2017.

(51) Int. Cl.
| | |
|---|---|
| *H01L 21/02* | (2006.01) |
| *H01L 27/092* | (2006.01) |
| *H01L 21/311* | (2006.01) |
| *H01L 29/08* | (2006.01) |
| *H01L 29/161* | (2006.01) |

(52) U.S. Cl.
CPC .. *H01L 21/02532* (2013.01); *H01L 21/31111* (2013.01); *H01L 21/31116* (2013.01); *H01L 21/823821* (2013.01); *H01L 27/0924* (2013.01); *H01L 29/0847* (2013.01); *H01L 29/161* (2013.01); *H01L 29/66545* (2013.01); *H01L 21/823807* (2013.01)

(58) Field of Classification Search
USPC .......................................... 257/60, 135, 302
See application file for complete search history.

(56) References Cited

U.S. PATENT DOCUMENTS

| | | | |
|---|---|---|---|
| 7,910,453 B2 | 3/2011 | Xu et al. | |
| 8,048,723 B2 | 11/2011 | Chang et al. | |
| 8,053,299 B2 | 11/2011 | Xu | |
| 8,183,627 B2 | 5/2012 | Currie | |
| 8,362,575 B2 | 1/2013 | Kwok et al. | |
| 8,367,498 B2 | 2/2013 | Chang et al. | |
| 8,377,779 B1 | 2/2013 | Wang | |
| 8,399,931 B2 | 3/2013 | Liaw et al. | |
| 8,415,718 B2 | 4/2013 | Xu | |
| 8,440,517 B2 | 5/2013 | Lin et al. | |
| 8,487,378 B2 | 7/2013 | Goto et al. | |
| 8,497,177 B1 | 7/2013 | Chang et al. | |
| 8,497,528 B2 | 7/2013 | Lee et al. | |
| 8,609,518 B2 | 12/2013 | Wann et al. | |
| 8,610,240 B2 | 12/2013 | Lee et al. | |
| 8,618,556 B2 | 12/2013 | Wu et al. | |
| 8,633,516 B1 | 1/2014 | Wu et al. | |
| 8,652,894 B2 | 2/2014 | Lin et al. | |
| 8,680,576 B2 | 3/2014 | Ching et al. | |
| 8,686,516 B2 | 4/2014 | Chen et al. | |
| 8,703,565 B2 | 4/2014 | Chang et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,729,634 B2 | 5/2014 | Shen et al. | |
| 8,735,993 B2 | 5/2014 | Lo et al. | |
| 8,736,056 B2 | 5/2014 | Lee et al. | |
| 8,742,509 B2 | 6/2014 | Lee et al. | |
| 8,772,109 B2 | 7/2014 | Colinge | |
| 8,776,734 B1 | 7/2014 | Roy et al. | |
| 8,785,285 B2 | 7/2014 | Tsai et al. | |
| 8,796,666 B1 | 8/2014 | Huang et al. | |
| 8,796,759 B2 | 8/2014 | Perng et al. | |
| 8,809,139 B2 | 8/2014 | Huang et al. | |
| 8,815,712 B2 | 8/2014 | Wan et al. | |
| 8,816,444 B2 | 8/2014 | Wann et al. | |
| 8,823,065 B2 | 9/2014 | Wang et al. | |
| 8,826,213 B1 | 9/2014 | Ho et al. | |
| 8,828,823 B2 | 9/2014 | Liu et al. | |
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 8,860,148 B2 | 10/2014 | Hu et al. | |
| 8,887,106 B2 | 11/2014 | Ho et al. | |
| 9,105,490 B2 | 8/2015 | Wang et al. | |
| 9,806,155 B1 | 10/2017 | Basker et al. | |
| 2011/0068407 A1 | 3/2011 | Yeh et al. | |
| 2013/0011983 A1 | 1/2013 | Tsai et al. | |
| 2013/0285153 A1 | 10/2013 | Lee et al. | |
| 2014/0001574 A1 | 1/2014 | Chen et al. | |
| 2014/0110755 A1 | 4/2014 | Colinge | |
| 2014/0151812 A1 | 6/2014 | Liaw | |
| 2014/0183600 A1 | 7/2014 | Huang et al. | |
| 2014/0252412 A1 | 9/2014 | Tsai et al. | |
| 2014/0264590 A1 | 9/2014 | Yu et al. | |
| 2014/0264592 A1 | 9/2014 | Oxland et al. | |
| 2014/0282326 A1 | 9/2014 | Chen et al. | |
| 2015/0263003 A1 | 9/2015 | Lee et al. | |
| 2016/0365432 A1 | 12/2016 | Basker et al. | |
| 2017/0243791 A1 | 8/2017 | Jacob | |
| 2019/0067126 A1 | 2/2019 | Chen et al. | |
| 2019/0326290 A1* | 10/2019 | Cea .................. H01L 29/41791 |
| 2020/0043804 A1 | 2/2020 | Chen et al. | |

* cited by examiner

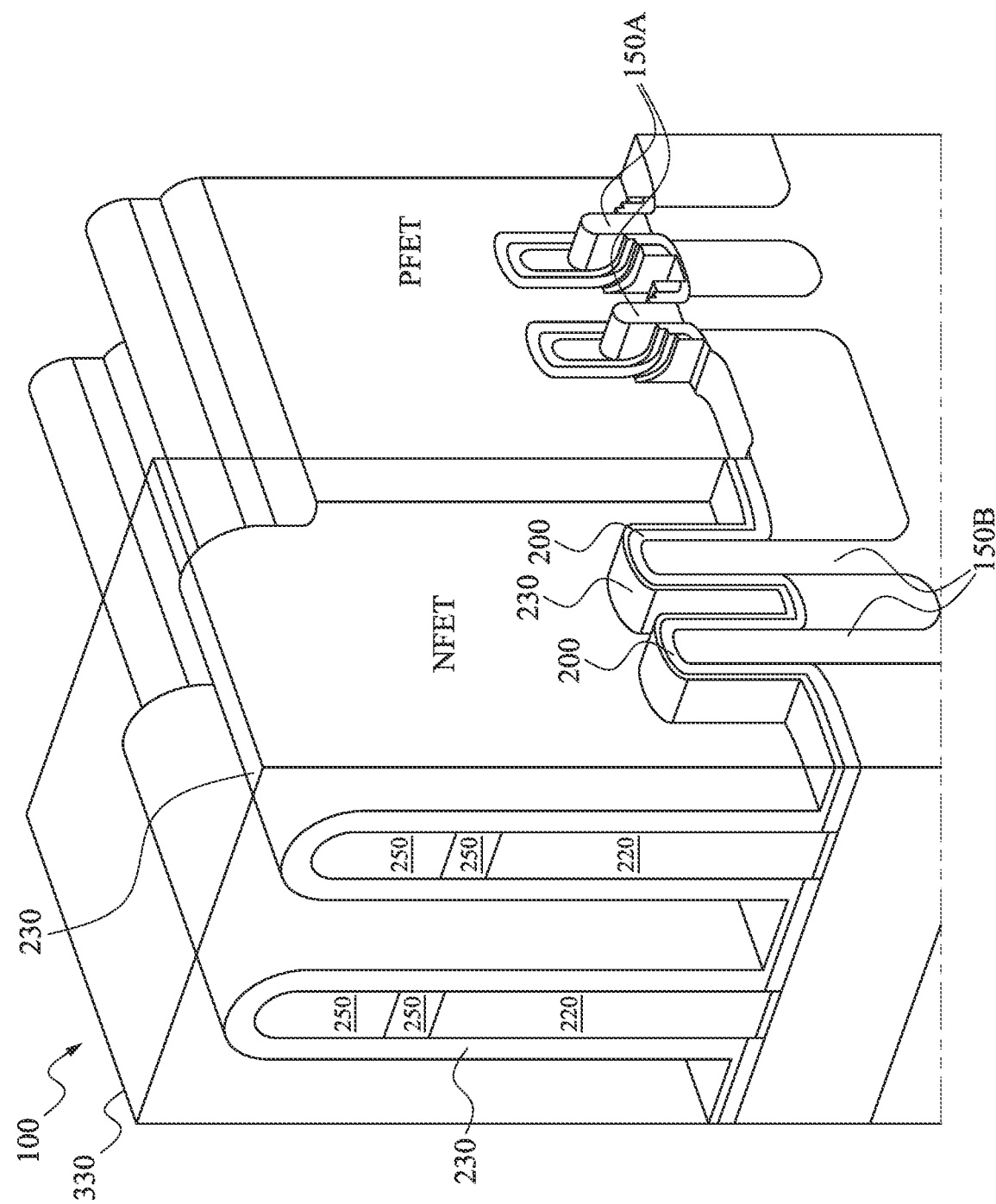

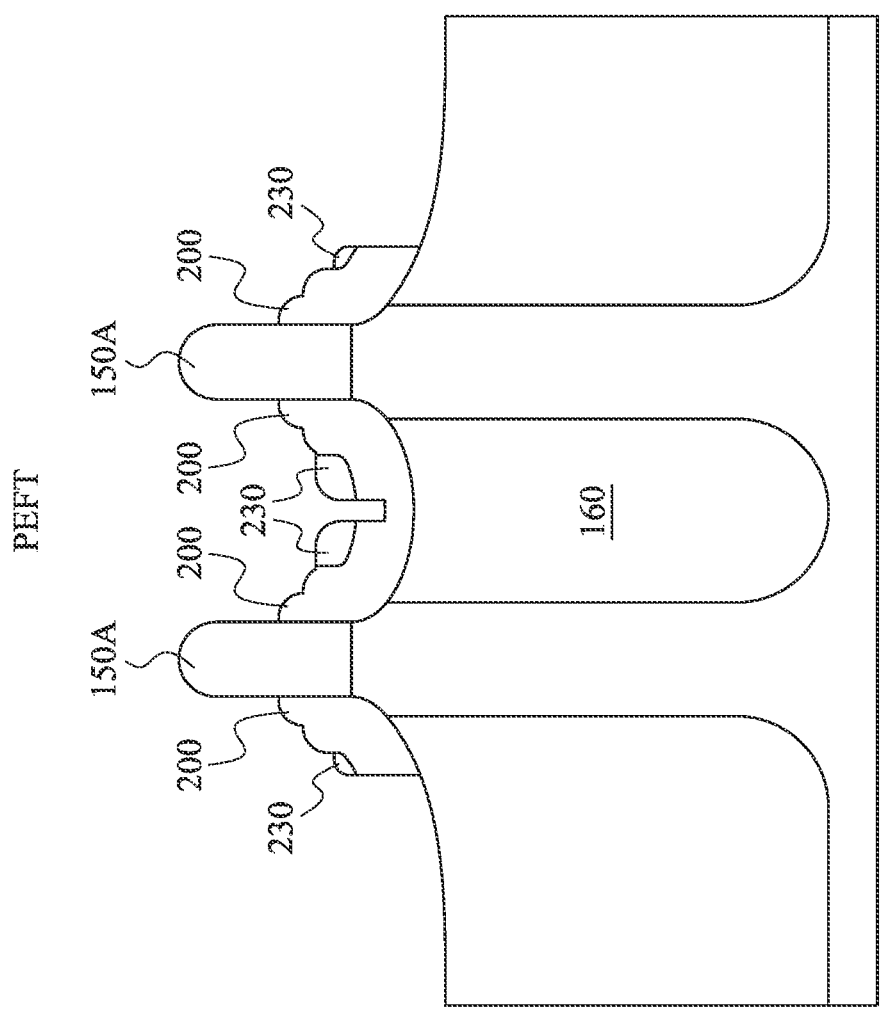

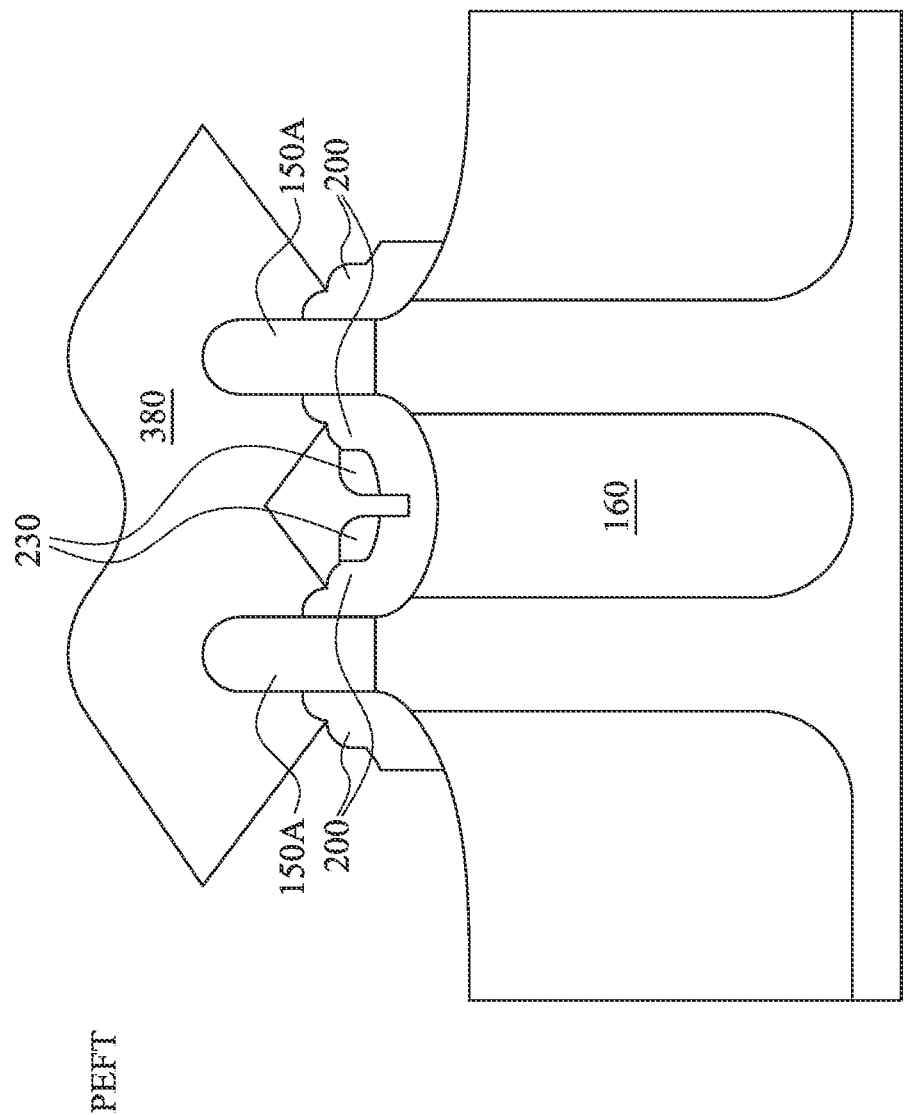

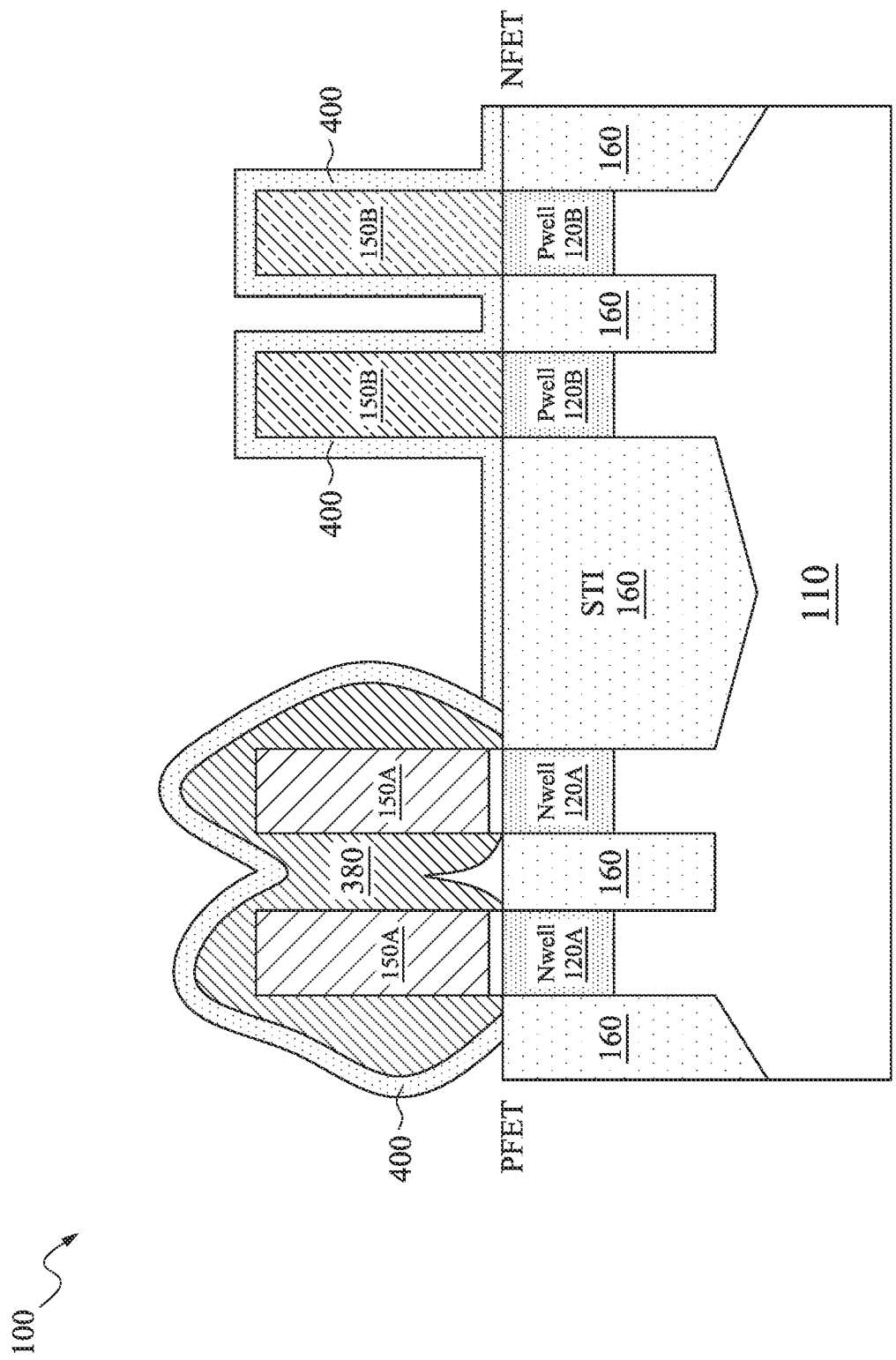

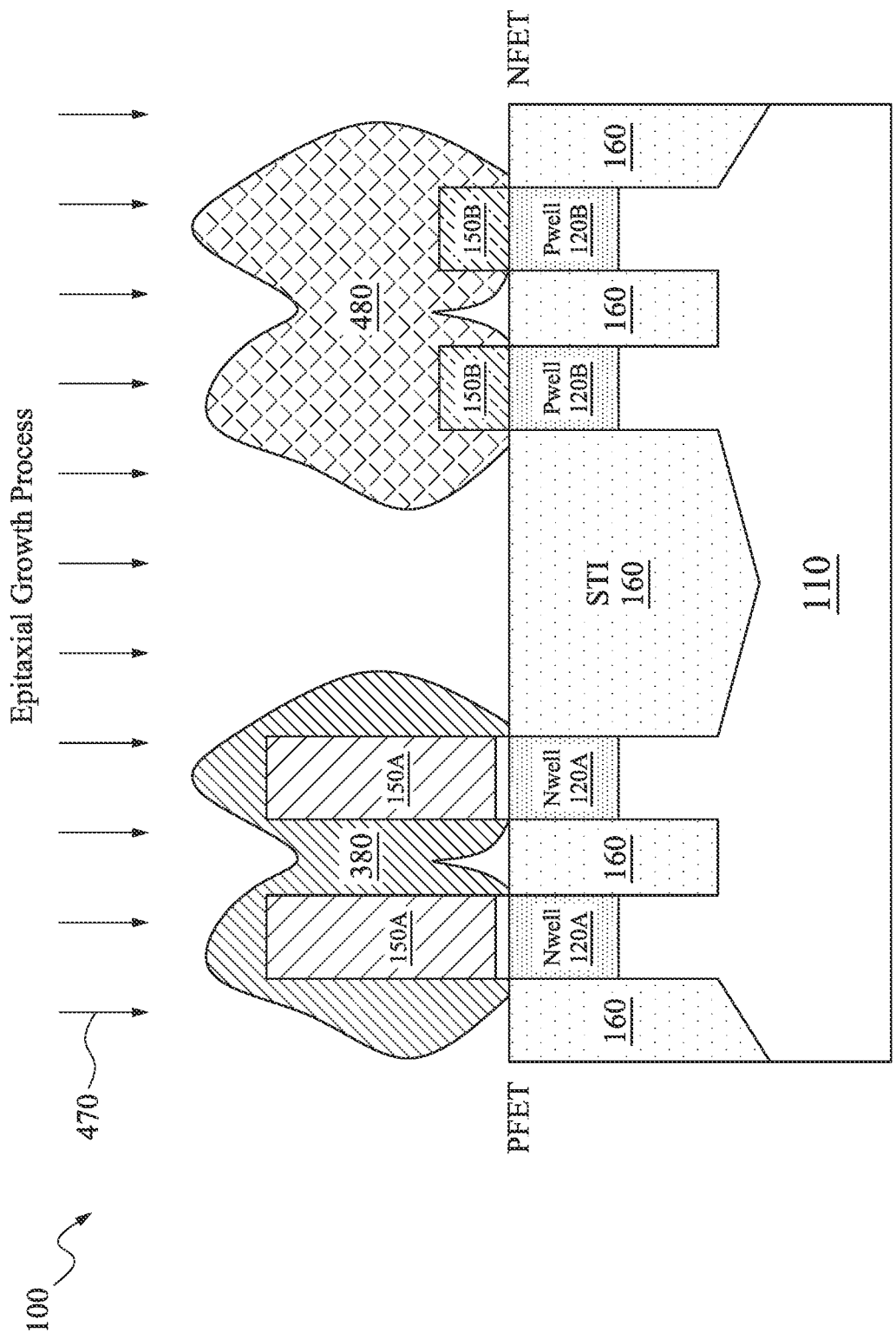

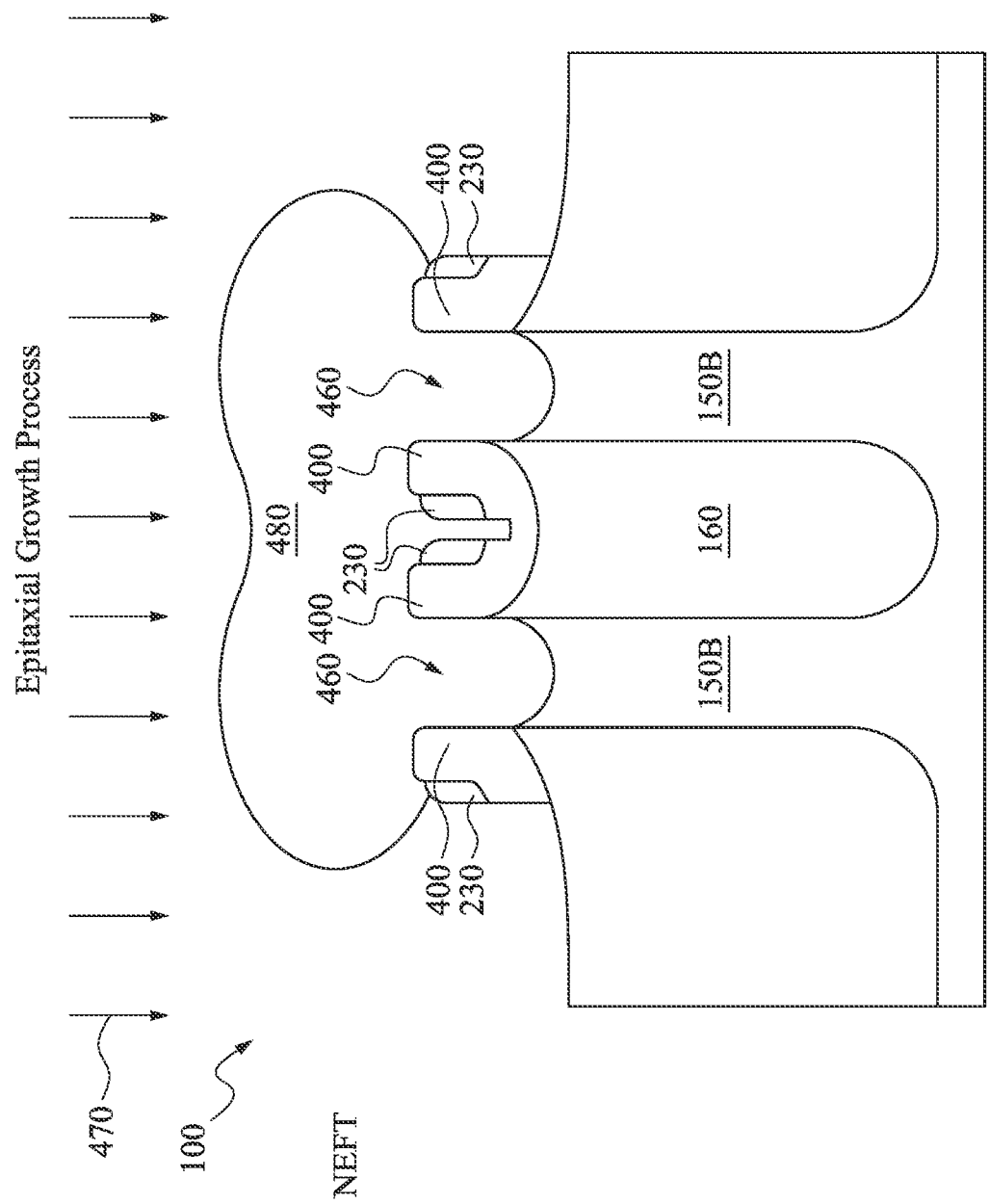

USING A METAL-CONTAINING LAYER AS AN ETCHING STOP LAYER AND TO PATTERN SOURCE/DRAIN REGIONS OF A FINFET

PRIORITY DATA

The present application is a continuation of U.S. patent application Ser. No. 16/599,912, filed Oct. 11, 2019, which is a divisional of U.S. patent application Ser. No. 15/966,186, filed on Apr. 30, 2018, now U.S. Pat. No. 10,453,753 issued Oct. 22, 2019, which is a utility application of provisional U.S. Patent Application No. 62/552,554, filed on Aug. 31, 2017 and entitled "Using a metal-containing layer as an etching stop layer and to pattern source/drain regions of a FinFET", the contents of which are hereby incorporated by reference in their entirety.

BACKGROUND

The semiconductor industry has progressed into nanometer technology process nodes in pursuit of higher device density, higher performance, and lower costs. As this progression takes place, challenges from both fabrication and design issues have resulted in the development of three-dimensional designs, such as fin-like field effect transistor (FinFET) device. A typical FinFET device is fabricated with a thin "fin" (or fin-like structure) extending from a substrate. The fin usually includes silicon and forms the body of the transistor device. The channel of the transistor is formed in this vertical fin. A gate is provided over (e.g., wrapping around) the fin. This type of gate allows greater control of the channel. Other advantages of FinFET devices include reduced short channel effect and higher current flow.

However, conventional FinFET devices may still have certain shortcomings. One shortcoming is that the manner in which the source/drain regions are defined for conventional FinFET fabrication has not been optimized. For example, the FinFET device may suffer from epi-selectivity loss in the formation of source/drain regions.

Therefore, while existing FinFET devices and the fabrication thereof have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-12A are Y-cut cross-sectional side views of FinFET devices at various stages of fabrication according to embodiments of the present disclosure.

FIGS. 5B-8B and 10B-12B are X-cut cross-sectional side views of FinFET devices at various stages of fabrication according to embodiments of the present disclosure.

FIGS. 5C, 7C, 8C, 11C and 12C are perspective three-dimensional views of FinFET devices at different stages of fabrication according to embodiments of the present disclosure.

FIGS. 7D, 8D, and 11D-12D are magnified Y-cut cross-sectional side views of a portion of the FinFET devices at different stages of fabrication according to embodiments of the present disclosure.

DETAILED DESCRIPTION

Figure 1:
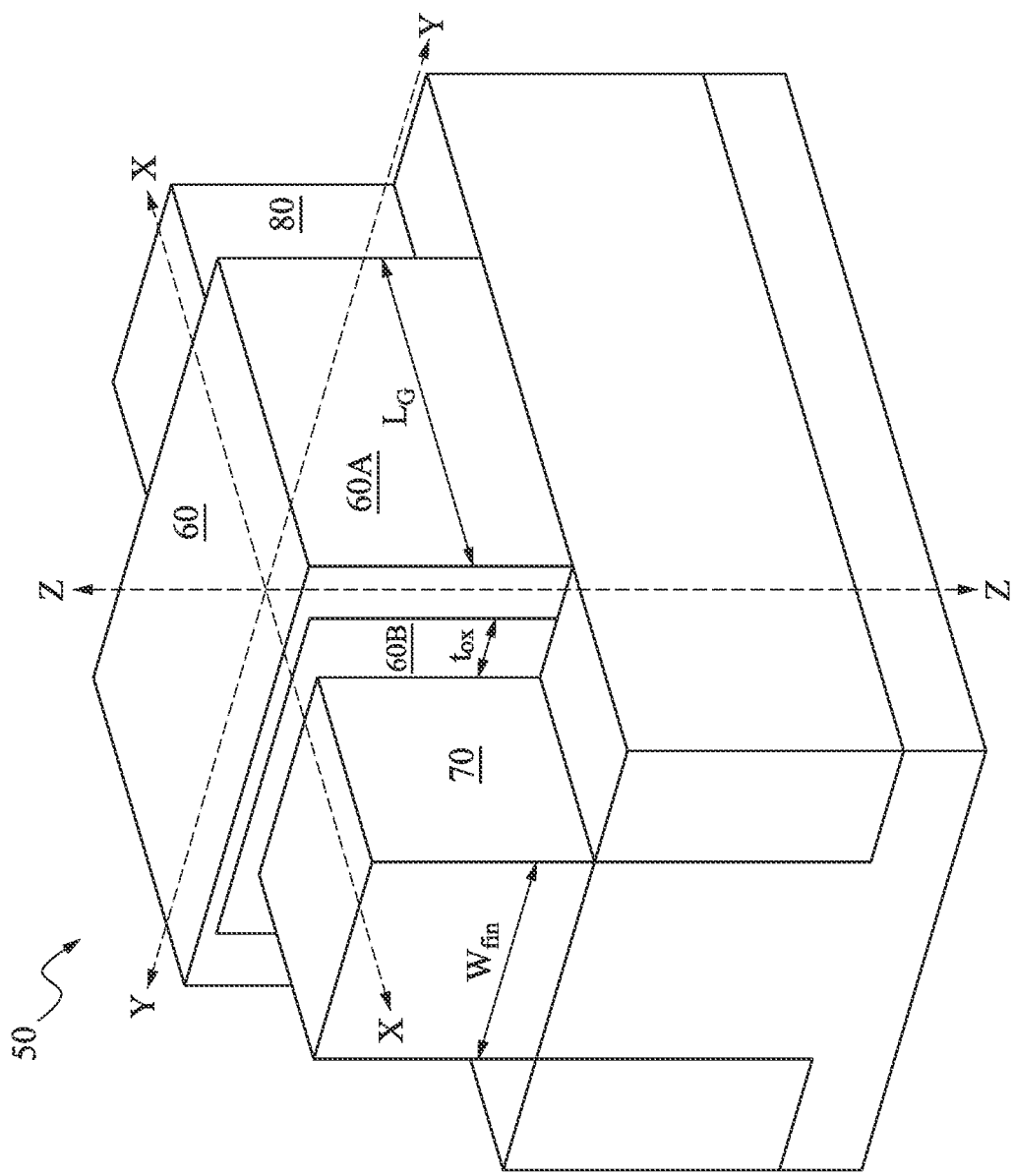
FIG. 1 is a perspective view of an example FinFET device.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present invention. It is understood, however, that the application should not be limited to a particular type of device, except as specifically claimed.

The use of FinFET devices has been gaining popularity in the semiconductor industry. Referring to FIG. 1, a perspective view of an example FinFET device 50 is illustrated. The FinFET device 50 is a non-planar multi-gate transistor that is built over a substrate (such as a bulk substrate). A thin silicon-containing "fin-like" structure (hereinafter referred to as a "fin") forms the body of the FinFET device 50. The fin extends along an X-direction shown in FIG. 1. The fin has a fin width $W_{fin}$ measured along a Y-direction that is orthogonal to the X-direction. A gate 60 of the FinFET device 50 wraps around this fin, for example around the top surface and the opposing sidewall surfaces of the fin. Thus, a portion of the gate 60 is located over the fin in a Z-direction that is orthogonal to both the X-direction and the Y-direction.

$L_G$ denotes a length (or width, depending on the perspective) of the gate 60 measured in the X-direction. The gate 60 may include a gate electrode component 60A and a gate dielectric component 60B. The gate dielectric 60B has a thickness $t_{ox}$ measured in the Y-direction. A portion of the gate 60 is located over a dielectric isolation structure such as shallow trench isolation (STI). A source 70 and a drain 80 of the FinFET device 50 are formed in extensions of the fin on opposite sides of the gate 60. A portion of the fin being wrapped around by the gate 60 serves as a channel of the FinFET device 50. The effective channel length of the FinFET device 50 is determined by the dimensions of the fin.

FinFET devices offer several advantages over traditional Metal-Oxide Semiconductor Field Effect Transistor (MOSFET) devices (also referred to as planar transistor devices). These advantages may include better chip area efficiency, improved carrier mobility, and fabrication processing that is compatible with the fabrication processing of planar devices. FinFET devices are also compatible with a high-k metal gate (HKMG) process flow. Thus, FinFET devices may be implemented as HKMG devices where the gates each that have a high-k gate dielectric and a metal gate electrode. For these benefits discussed above, it may be desirable to design an integrated circuit (IC) chip using FinFET devices for a portion of, or the entire IC chip.

However, traditional FinFET fabrication methods may still have shortcomings. One shortcoming is that the manner in which the source/drain regions are defined for conventional FinFET fabrication has not been optimized. As a result, the FinFET device may suffer from epi-selectivity loss in the formation of source/drain regions. To improve the problems associated with conventional FinFET devices, the present disclosure utilizes a metal-containing layer in patterning processes to help define the source/drain regions of the FinFET devices, as discussed in more detail below. In more detail, FIGS. 2A-12A are Y-cut cross-sectional side views of FinFET devices 100 at various stages of fabrication, FIGS. 5B-8B and 10B-12B are X-cut cross-sectional side views of FinFET devices 100 at various stages of fabrication, FIG. 4D is a top view of FinFET devices 100 at a stage of fabrication, FIGS. 5C, 7C, 8C, and 11C-13C are perspective three-dimensional views of FinFET devices 100 at different stages of fabrication, and FIGS. 7D, 8D, and 11D-12D are magnified Y-cut cross-sectional side views of a portion of the FinFET devices at different stages of fabrication.

Figure 2A:
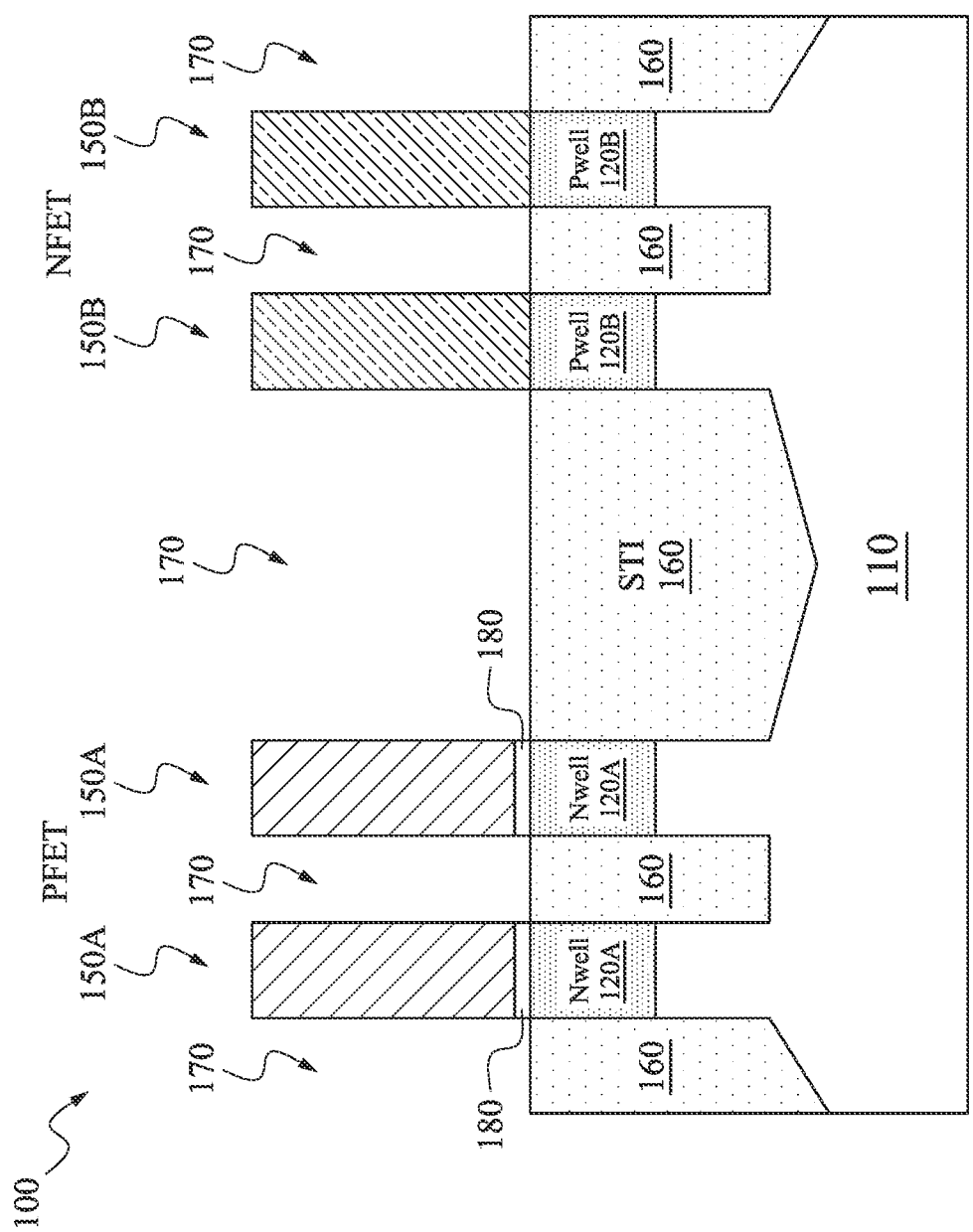

Referring now to FIG. 2A, FinFET devices 100 include a semiconductor layer 110 that is formed over a substrate. In an embodiment, the semiconductor layer 110 includes a crystal silicon material, such as silicon or silicon germanium. An implantation process may be performed to implant a plurality of dopant ions to the semiconductor layer 110. The dopant ions may include an n-type material in some embodiments, for example arsenic (As) or phosphorous (P), or they may include a p-type material in some other embodiments, for example boron (B), depending on whether an n-type FET (NFET or NMOS) or a p-type FET (PFET or PMOS) is needed. For example, Nwells 120A may be formed for the PFET, and Pwells 120B may be formed for the NFET.

A plurality of fin structures is formed by patterning the semiconductor layer 110 through one or more lithography processes. For example, fin structures 150A are formed for the PFET, and fin structures 150B are formed for the NFET. The lithography processes used to form the fin structures 150A/150B may include forming a patterned photoresist, using the patterned photoresist to pattern hard mask layers therebelow, and using the patterned hard mask layers to define the fin structures 150A/150B. It is understood that the portions of the fin structures 150A/150B may serve as the source, drain, or channel regions of the FinFET devices 100. The channel regions may include silicon or silicon germanium.

Isolation structures 160 are formed to electrically isolate the fin structures 150A/150B. The isolation structures 160 may also be referred to as shallow trench isolation (STI) structures. In some embodiments, the isolation structures 160 contain a dielectric material such as silicon oxide or silicon nitride. The isolation structures 160 may be formed by depositing the dielectric material to fill the openings defined by the fin structures 150A/150B, and then performing a polishing process (such as chemical mechanical polishing) to planarize the surface of the deposited dielectric material. One or more etching processes may then be performed to the dielectric material to form recesses 170 by removing portions (but not all) of the material from the isolation structures 160. The etching processes define the "height" (in the Z-direction of FIG. 1) of the fin structures 150A/150B.

As shown in FIG. 2A, the fin structures 150A/150B protrude upwards (e.g., upward along the Z-axis of FIG. 1) and out of the isolation structures 160. In other words, at least a portion of each fin structure 150A/150B is exposed and not covered by the isolation structures 160. It is also understood that an optional undoped semiconductor layer (e.g., undoped silicon) 180 may be disposed between the fin structures 150A and the N-well in some embodiments. In other embodiments, the layer 180 may be omitted.

Figure 3A:
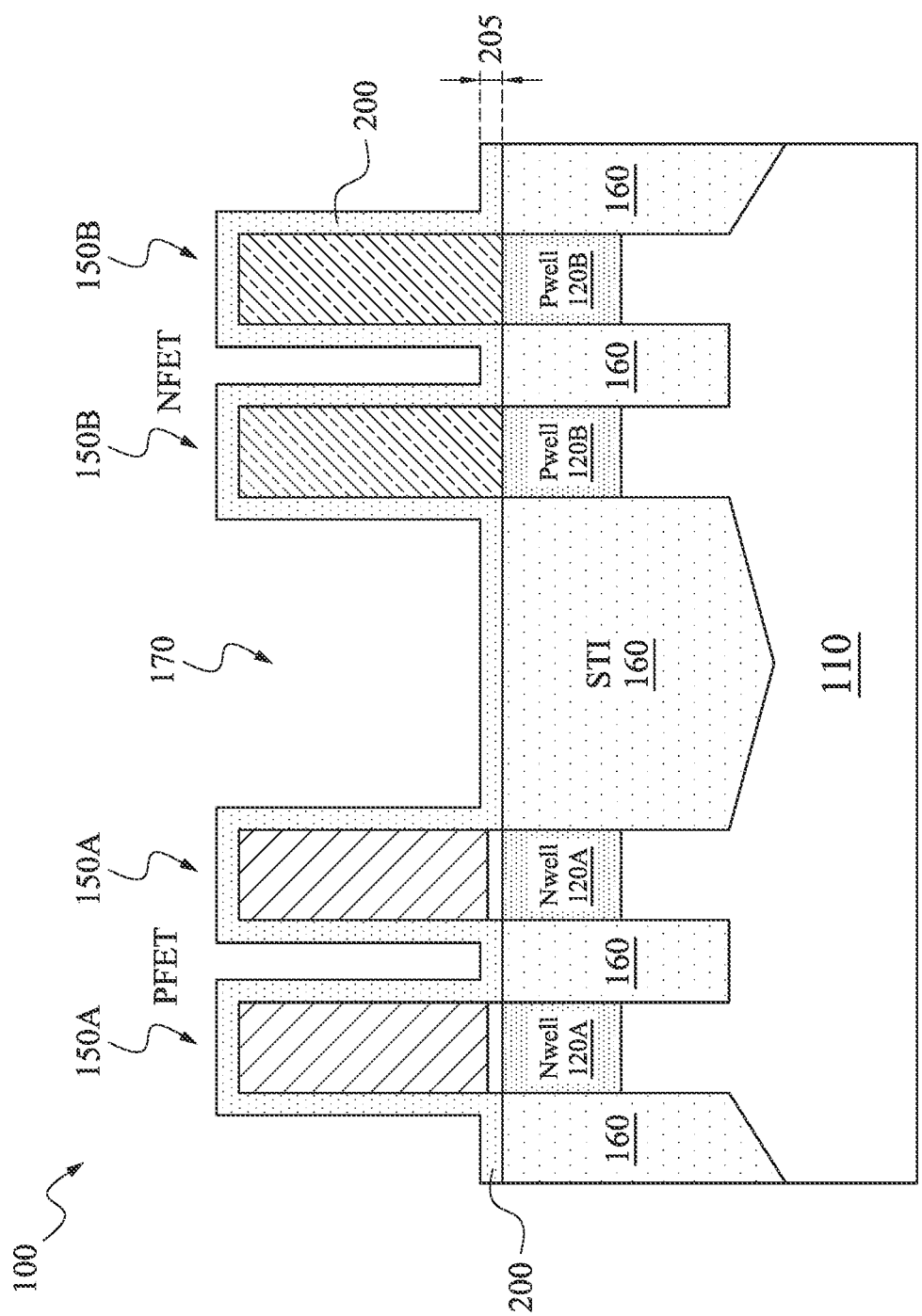

Referring now to FIG. 3A, a layer 200 is formed over the side and top surfaces of the fin structures 150A/150B for both the PFET and the NFET. The layer 200 is also formed over an upper surface of the isolation structures 160 and partially fills the recesses 170. The layer 200 serves as an etching-stop layer in a later etching process, which will be discussed below in more detail. Conventional FinFET fabrication processes do not form this layer 200.

In some embodiments, the layer 200 includes a dielectric layer, for example a metal-containing dielectric layer. The presence of metal in the layer 200 helps facilitate a removal of the layer 200 in a wet etching process to be performed later, where an SC1 solution (H2O:H2O2:NH4OH) and/or an SC2 solution (HC1:H2O2:H2O) may be used as an etchant. In some embodiments, phosphoric acid (H3PO4) may also be used as an etchant in the wet etching process. The easy removal of the layer 200 in the subsequent etching process makes the layer 200 a good candidate for being a patterning layer. In some embodiments, the layer 200 includes aluminum oxide ($Al_2O_3$). The layer 200 may be formed to any suitable thickness using any suitable deposition technique (e.g., CVD, HDP-CVD, ALD, etc.). In the illustrated embodiment, the layer 200 is formed using a conformal CVD and/or ALD deposition process and is formed to have a thickness 205. In some embodiments, the thickness 205 is in a range from about 2 nanometers (nm) to about 20 nm. It is understood that the material composition and the thickness range of the layer 200 are specifically configured so that it can adequately serve as the etching-stop layer and also to facilitate the easy removal in the wet etching process below.

Figure 4A:
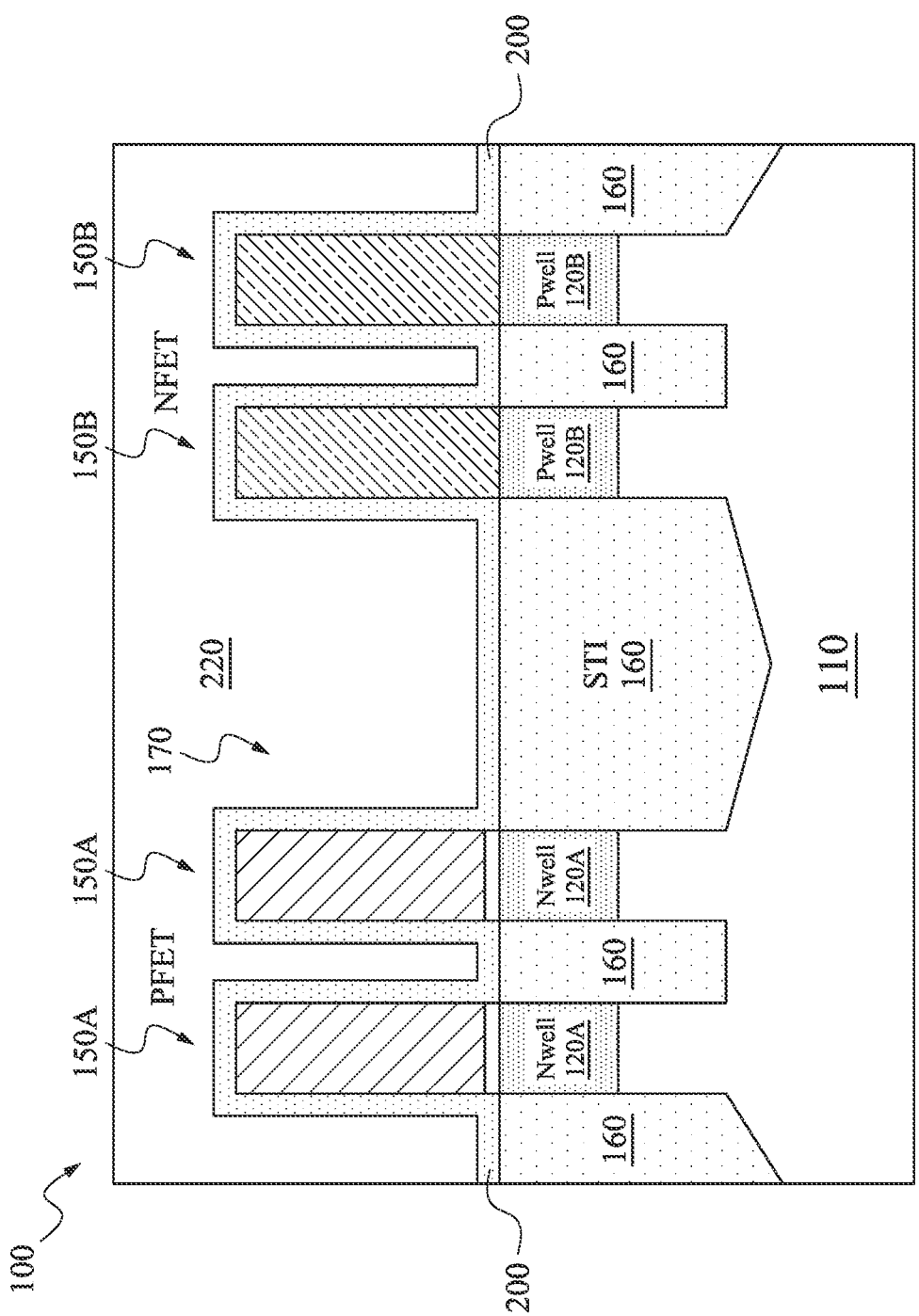
Figure 4D:
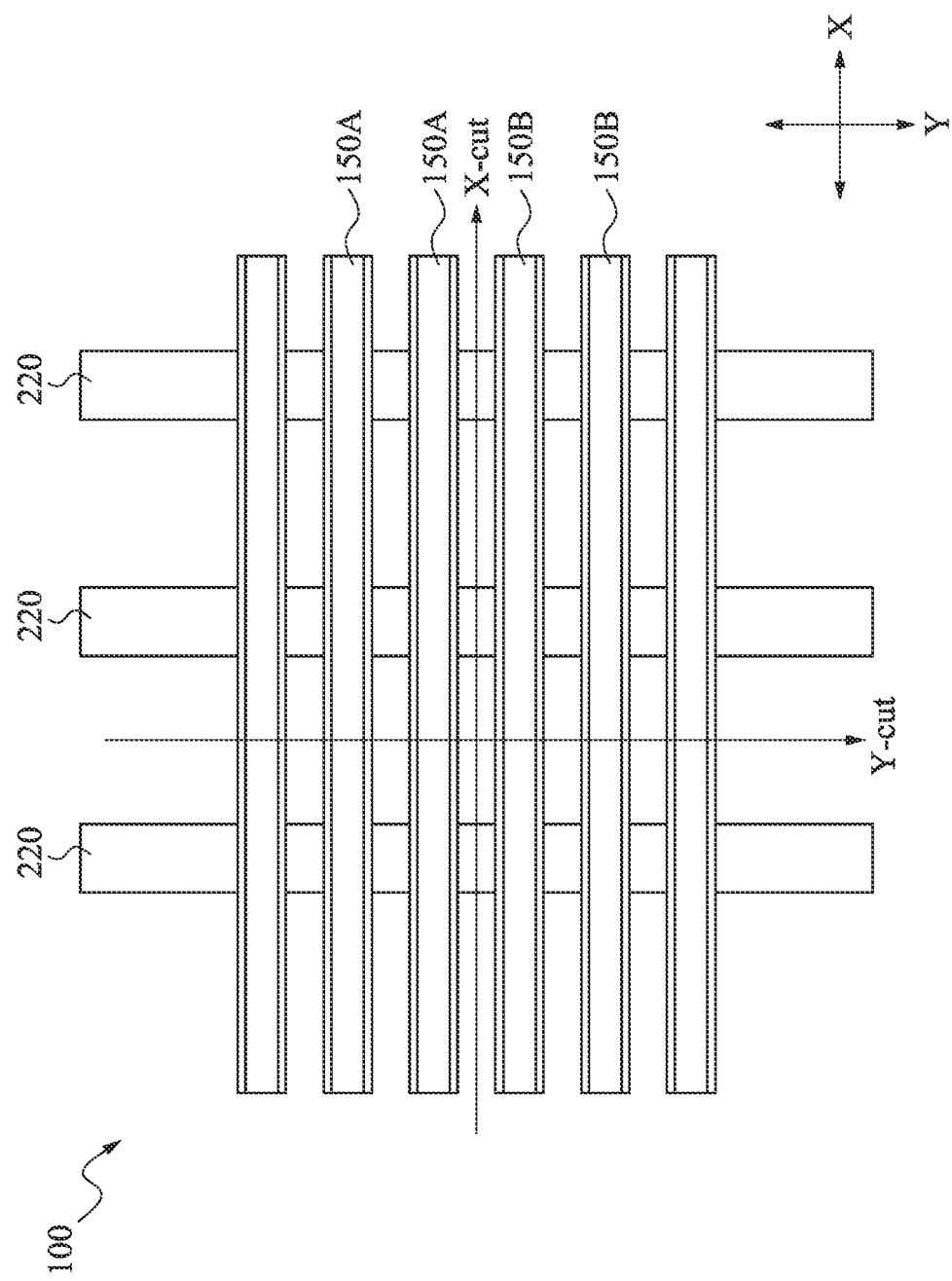
FIG. 4D is a top view of FinFET devices at a stage of fabrication according to embodiments of the present disclosure.

Referring now to FIG. 4A, a gate electrode layer 220 is formed over the fin structures 150A/150B and over the layer 200. In some embodiments, the gate electrode layer 220 is a dummy gate electrode layer that will be removed in a later process. For example, the gate electrode layer 220 may include polysilicon, which will be removed and replaced with a metal gate electrode in a gate-replacement process in a later fabrication step. The gate electrode layer 220 may be formed by one or more deposition processes, such as chemical vapor deposition (CVD), physical vapor deposition (PVD), atomic layer deposition (ALD), or combinations thereof.

After the deposition of the gate electrode layer 220, one or more etching processes may be performed to the gate electrode layer 220 to define a gate length Lg (measured in the X-direction as shown in FIG. 1). In other words, the gate electrode layer 220 is patterned by the one or more etching processes into separate gate electrode stacks 220. This is illustrated in more detail in FIG. 4D, which is a top view of the FinFET devices 100. As shown in the top view of FIG. 4D, a plurality of fin structures (e.g., the fin structures 150A/150B) extend in the X-direction (the same X-direction as shown in FIG. 1), and a plurality of patterned gate electrode stacks 220 extend in the Y-direction (the same Y-direction as shown in FIG. 1). A Y-cut (in the Y-direction) of the FinFET devices 100 in the top view produces the cross-sectional view shown in FIG. 4A. An X-cut (in the X-direction) of the FinFET devices 100 in the top view will produce a different cross-sectional view, which will be discussed below in more detail with reference to FIGS. 5B-8B and 10B-12B.

Figure 5A:
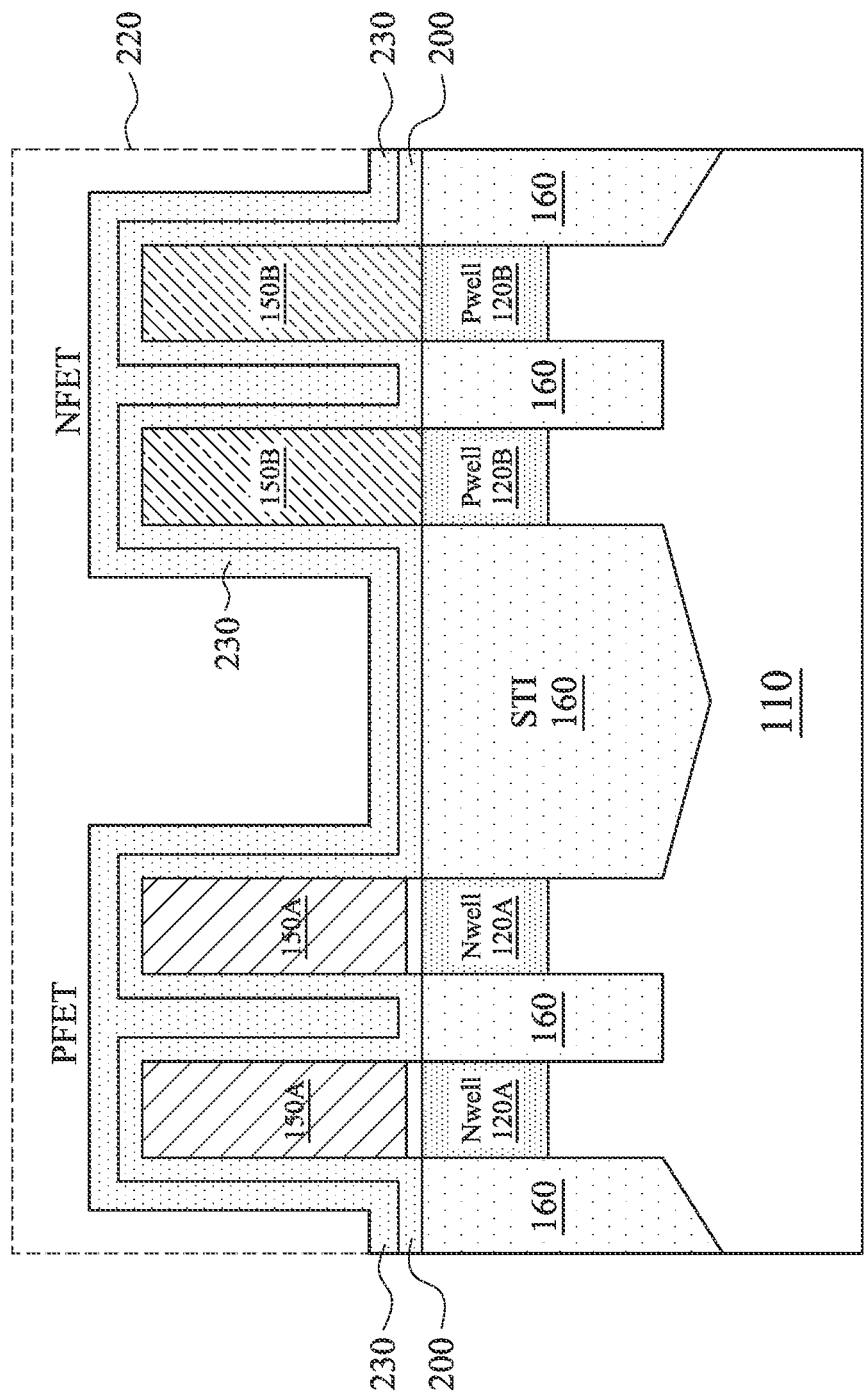
Figure 5B:
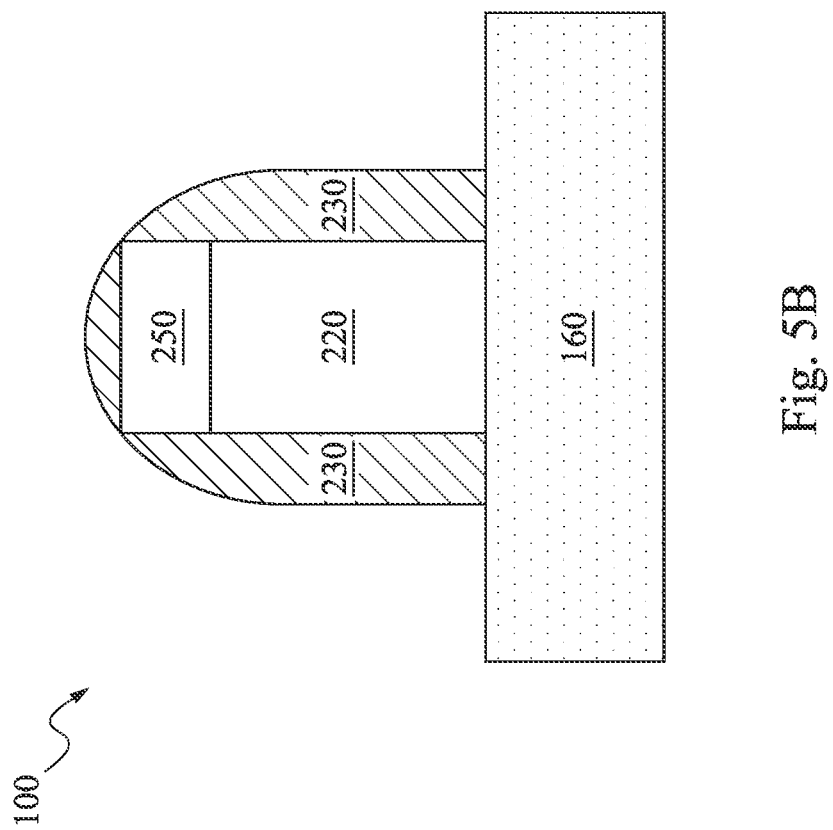
Figure 5C:
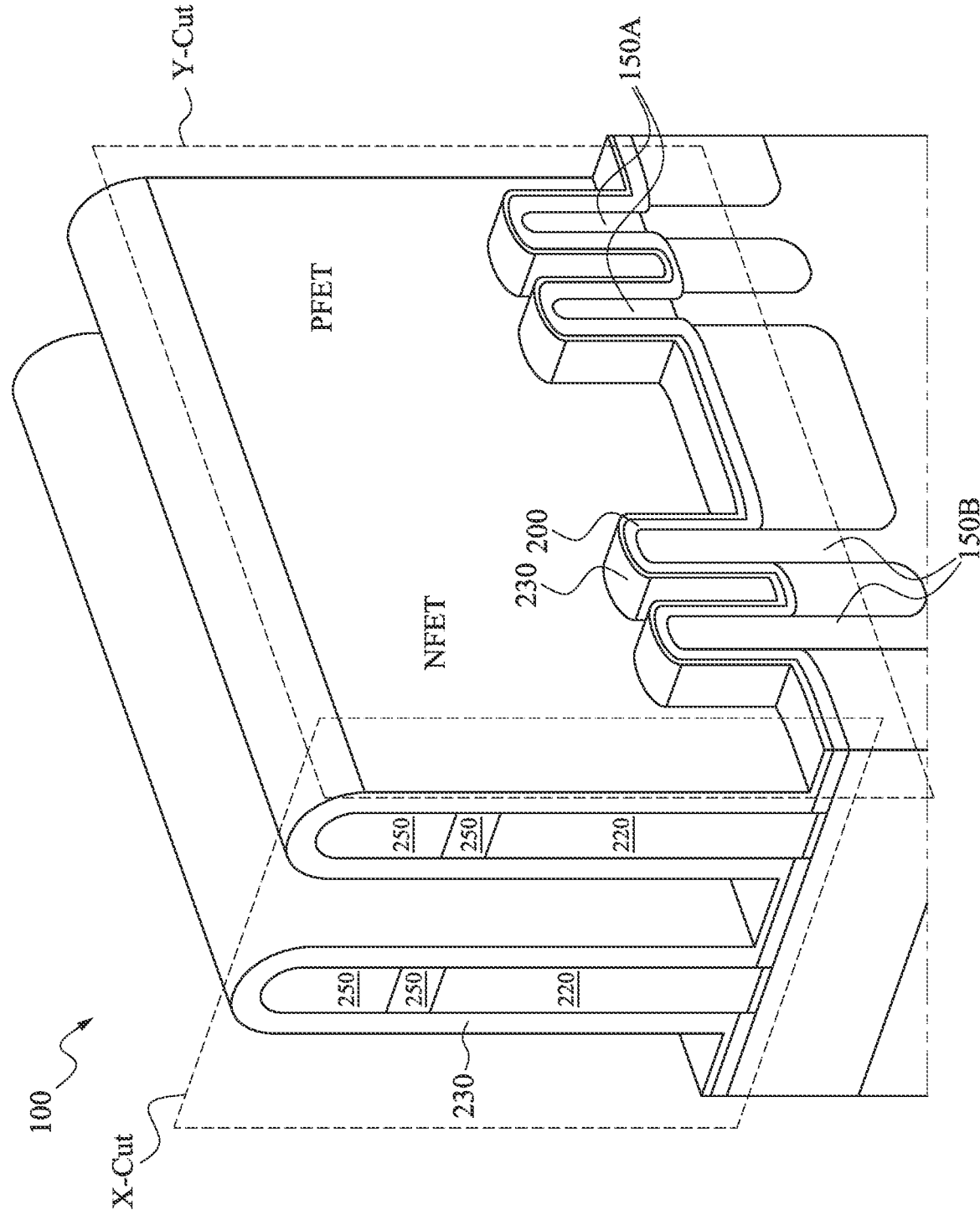

Referring now to FIGS. 5A, 5B, and 5C, a dielectric layer 230 is formed over the layer 200 and also over the patterned gate electrode stacks 220. FIG. 5A is a cross-sectional view obtained using the Y-cut, and FIG. 5B is a cross-sectional view obtained using the X-cut. The X-cut and Y-cut are also illustrated in FIG. 5C, which is a perspective three-dimensional view of the FinFET devices 100.

As shown in FIG. 5C (and also in FIG. 5A obtained according to the Y-cut), the layer 200 is formed on the side surfaces and top surfaces of each of the fin structures 150A and 150B. The dielectric layer 230 is then formed on the side surfaces and top surfaces of the layer 200. Note that in FIG. 5A, since the Y-cut is taken outside the gate electrode stacks 220, the gate electrode stacks 220 should not be directly visible in the cross-sectional view of FIG. 5A. However, to facilitate the understanding of the present disclosure, one of the gate electrode stacks 220 is still shown with broken lines in FIG. 5A, to illustrate that it is located "behind" the fin structures 150A/150B and the layers 200 and 230.

As shown in FIG. 5C (and also in FIG. 5B obtained according to the X-cut), no portion of the layer 200 is formed on the sidewalls of the gate electrode stacks 220, since the gate electrode stacks 220 are formed and defined after the deposition of the layer 200. But the dielectric layer 230 is formed after the formation of the gate electrode stacks 220, and thus the dielectric layer 230 is formed on the sidewalls of the gate electrode stacks 220. Note that as shown in FIGS. 5A and 5C, there may be one or more hard mask layers 250 disposed over each gate electrode stack 220. The one or more hard mask layers 250 are used to pattern the gate electrode stacks 220 and define the dimensions of the gate electrode stacks 220. In some embodiments, the one or more hard mask layers 250 include an oxide material, for example silicon oxide. As shown in FIGS. 5B and 5C, the dielectric layer 230 is formed over the side surfaces and top surfaces of the hard mask layers 250.

It is understood that the material compositions of the dielectric layer 230 and the layer 200 are configured such that an etching selectivity exists between the dielectric layer 230 and the layer 200 in a subsequent etching process. In other words, the dielectric layer 230 and the layer 200 have substantially different etching rates (e.g., 10 times or more) in the subsequent etching process. In some embodiments, the dielectric layer 230 includes a nitride material, for example silicon nitride, while the layer 200 includes a metal-containing oxide material, such as aluminum oxide ($Al_2O_3$). The dielectric layer 230 is used to define the active regions and source/drain regions of the FinFET devices 100. The dielectric layer 230 also serves as a dummy spacer.

Also note that the X-cut taken to obtain FIG. 5B is taken outside of the fin structures 150A/150B, and thus the fin structures 150A/150B are not visible in the cross-sectional view of FIG. 5B, and instead the isolation structure 160 is shown as being located below the gate electrode stack 220. It is understood that if the X-cut is moved to a point where it intersects with one of the fin structures 150A or 150B (as is the case for some of the figures discussed below), then the fin structure 150A or 150B would be shown as being located below the gate electrode stack 220, since each gate electrode stack 220 wraps around the top and side surfaces of the fin structures 150A and 150B.

Figure 6A:
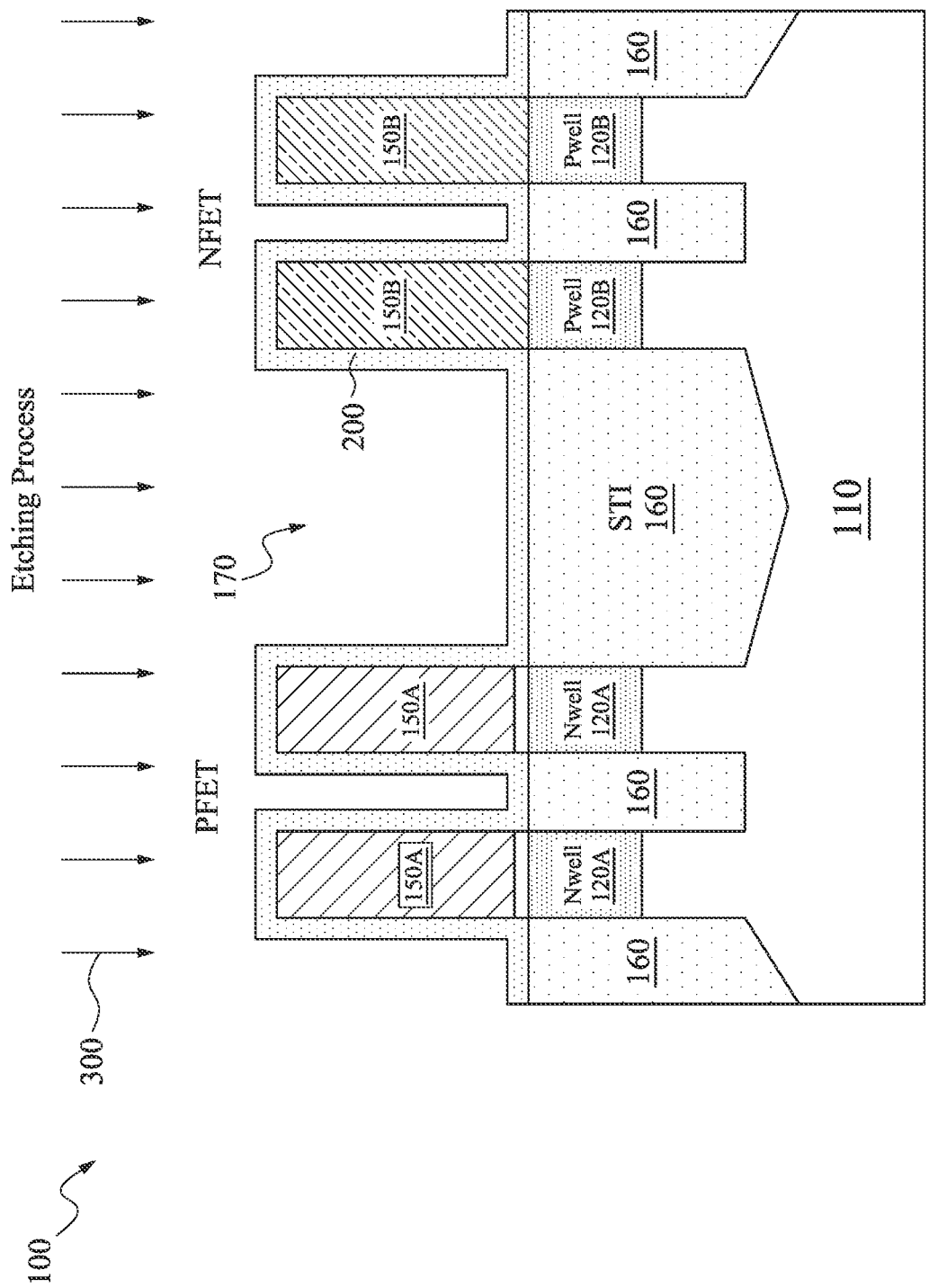
Figure 6B:
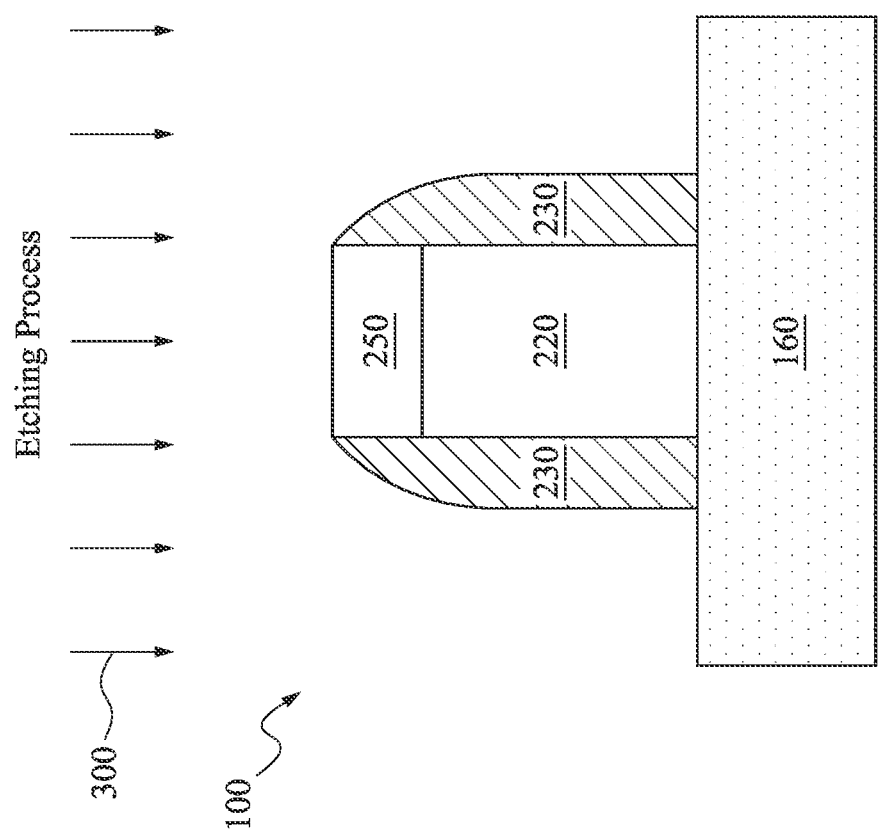

Referring now to FIGS. 6A and 6B, an etching process 300 is performed to the FinFET devices 100 to remove portions of the dielectric layer 230 formed over the fin structures 150A and 150B, while not removing portions of the dielectric layer 230 formed on the sidewalls of the gate electrode stacks 220. Note that the etching process 300 also removes the portions of the dielectric layer 230 above the hard mask 250, as shown in FIG. 6B. In some embodiments, the etching process 300 includes a dry etching process, which facilitates the selective removal (i.e., removing the dielectric layer 230 for the fin structures 150A/150B while keeping the dielectric layer 230 for the gate electrode stacks 220) of the dielectric layer 230. Again, since the X-cut corresponding to FIG. 6B is taken outside of the fin structures 150A/150B, the removal of the dielectric layer 230 over the fin structures 150A and 150B may not be directly apparent in FIG. 6B.

As discussed above, the material compositions of the dielectric layer 230 and the layer 200 are configured such that an etching selectivity exists between them in the etching process 300. As such, the layer 200 functions as an etching-stop layer during the etching process 300. That is, the etching process 300 removes the portions of the dielectric layer 230 located over the top and side surfaces of the fin structures 150A/150B, but the layer 200 prevents the etching process 300 from etching the fin structures 150A/150B themselves.

Figure 7A:
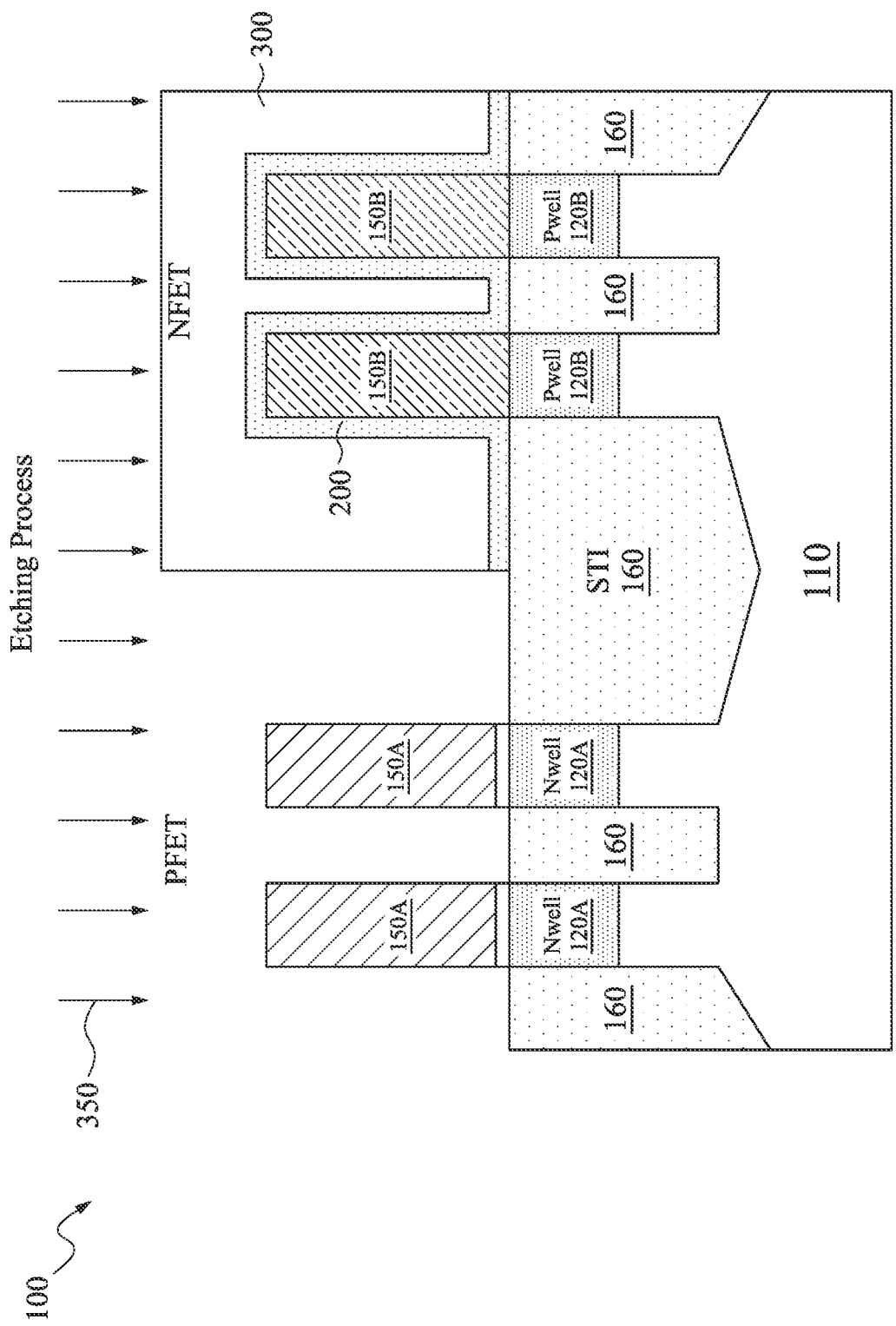
Figure 7B:
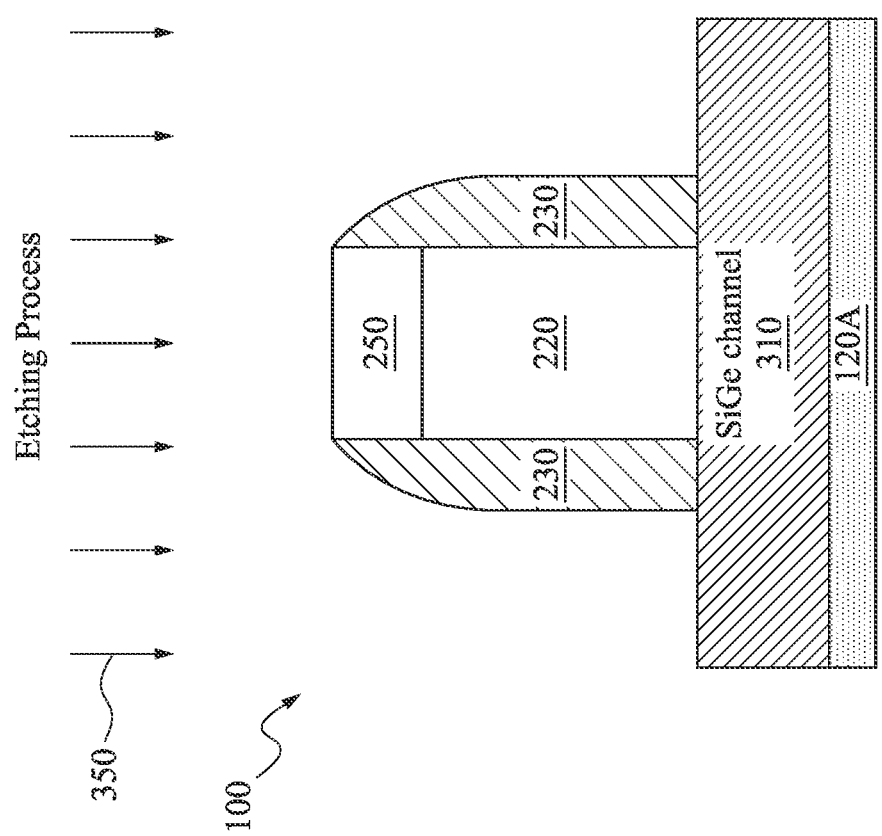

Referring now to FIGS. 7A, 7B, and 7C, the source/drain regions are defined for the PFET. Similar to FIG. 5C discussed above, FIG. 7C is a perspective three-dimensional view of the FinFET devices 100, FIG. 7A is a cross-sectional view obtained using the Y-cut, and FIG. 7B is a cross-sectional view obtained using the X-cut. The Y-cut corresponding to FIG. 7A is taken at the fin structures, as was the case for FIG. 5A. However, the X-cut corresponding to FIG. 7B is now moved (compared to FIG. 5B) such that the X-cut now intersects with the fin structures 150A of the PFET. As such, FIG. 7B produced by the X-cut in FIG. 7C now shows a portion of the silicon germanium (SiGe) channel 310, which is a portion of the fin structure 150A. Also as shown in FIG. 7B, Nwells 120A are located below the SiGe channel 310.

In order to define the source/drain regions for the PFET, the NFET portion of the FinFET devices 100 is covered up by a patterned photoresist layer 330. The PFET portion of the FinFET devices 100 is exposed. An etching process 350 is then performed to the PFET portion of the FinFET devices 100. In some embodiments, the etching process 350 includes a wet etching process. The etching process 350 removes the layer 200 but leaves the dielectric layer 230 intact, due to the etching selectivity between the layer 200 and the dielectric layer 230. Note that as shown in FIG. 7C, the previous etching process 300 has already removed the portions of the dielectric layer 230 formed over the fin structures 150A/150B, but portions of the dielectric layer 230 still remain on the sidewalls of the gate electrode stacks 220. Therefore, the etching process 350 leaves intact the portions of the dielectric layer 230 disposed on the sidewalls of the gate electrode stacks 220, while removing the layer 200.

In some embodiments, the etching process 350 uses an SC1 solution (H2O:H2O2:NH4OH) and/or an SC2 solution (HCl:H2O2:H2O) as an etchant. In some other embodiments, phosphoric acid (H3PO4) may also be used as an etchant in the etching process 350. The material composition for the layer 200 is configured such that it is easily removable by the etching process 350. For example, in embodiments where the layer 200 contains aluminum oxide, aluminum oxide is easily removable by the SC1 solution and/or the SC2 solution, or by the phosphoric acid. The easy removability of the layer 200 makes it a suitable layer for performing patterning processes.

As shown in FIG. 7A, the removal of the layer 200 for the PFET exposes the top and side surfaces of the fin structures 150A. It is understood that in actual fabrication, the removal of the layer 200 may not be 100%. In other words, residue of the layer 200 may still remain even after the etching process 350 is performed. For example, while the top surface and the upper parts of the sidewalls of the fin structures 150A may be exposed after the etching process 350 is performed to remove the layer 200, the lower parts of the fin structures 150A may still have remnants of the layer 200 disposed thereon, for example as shown in FIG. 7D, which is a more magnified cross-sectional view of the PFET of FIG. 7A. As shown in FIG. 7D, while an upper portion of the fin structures 150A are exposed, remnants of the layer 200 may still be disposed on sidewalls of a lower portion of the fin structures 150A, even after the etching process 350 is performed.

Similarly, the removal of the dielectric layer 230 in the preceding etching process 300 also may not completely remove the dielectric layer 230. For example, as shown in FIG. 7D, residue of the dielectric layer 230 may also remain disposed on the remnants of the layer 200 after the etching process 350 is performed. In any case, the exposed portions (i.e., the upper portion) of the fin structures 150A are capable of epitaxially growing the source/drain regions of the PFET, which will be discussed below.

Meanwhile, the fin structures 150B for the NFET are not exposed, since the layer 200 (which is not removed due to being protected by the patterned photoresist layer 330) is still disposed on the fin structures 150B. In this manner, the removal of the dielectric layer 200 for the PFET (but not for the NFET) exposes the fin structures for the PFET, thereby allowing the S/D regions of the PFET to be defined.

Figure 8A:
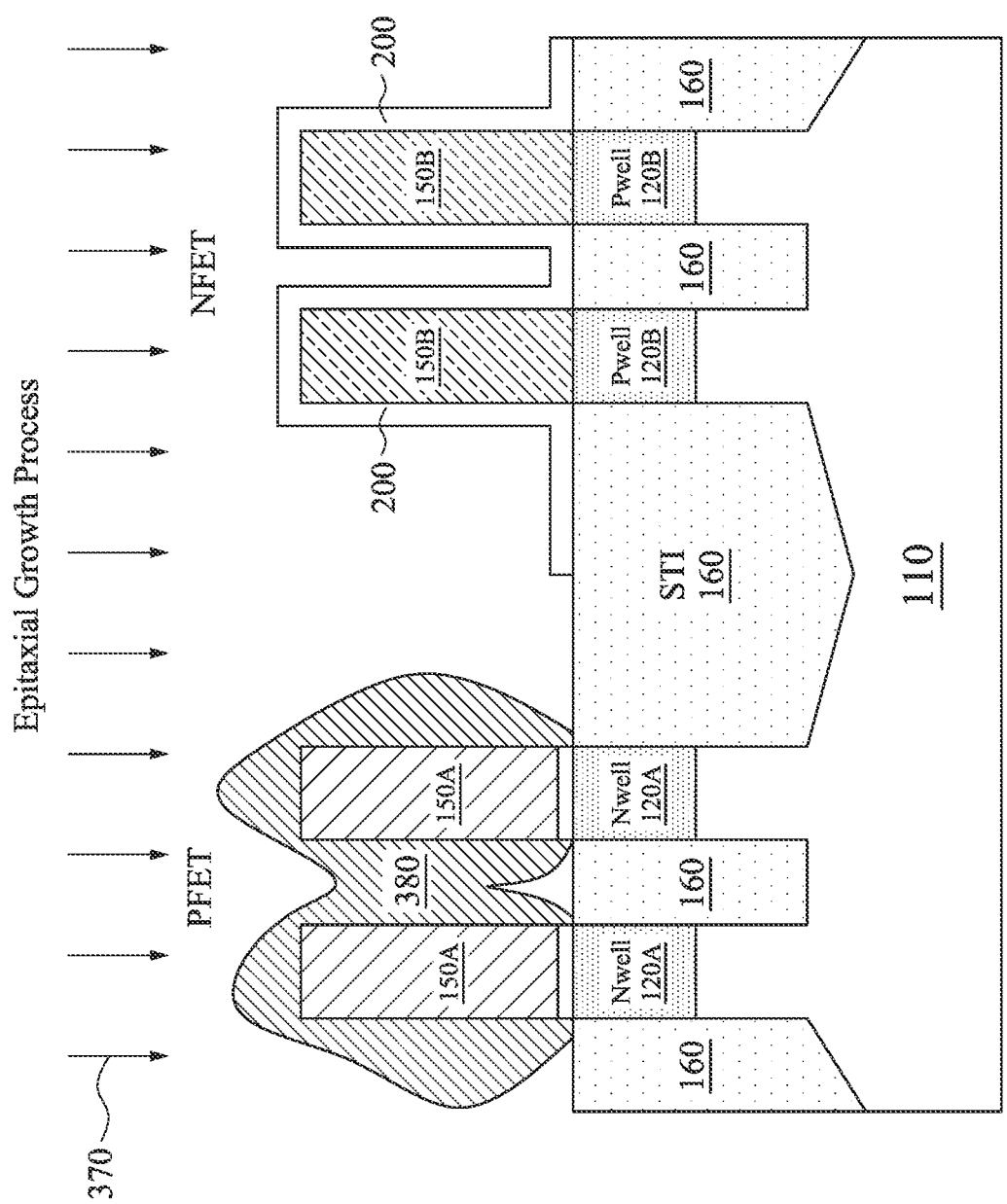
Figure 8B:
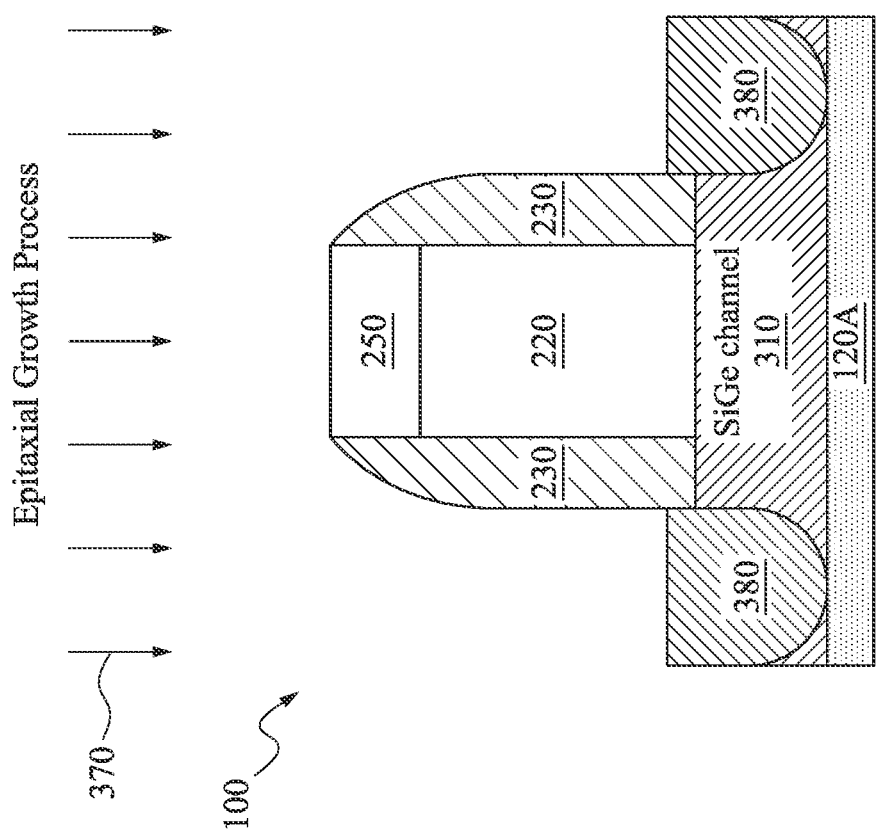
Figure 8C:
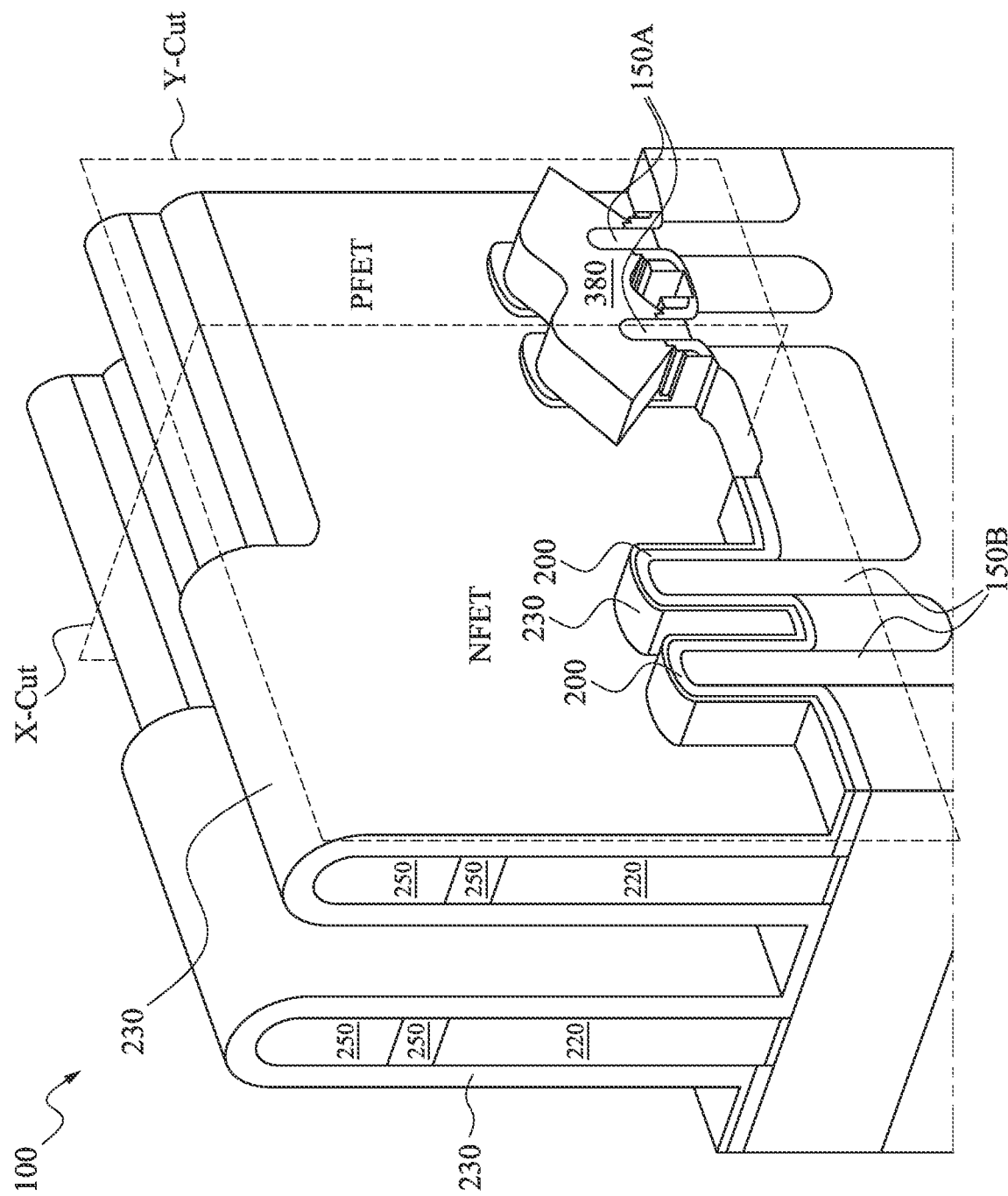

Referring now to FIGS. 8A, 8B, 8C, and 8D, the patterned photoresist layer 330 is removed, and an epitaxial growth process 370 is performed to epitaxially grow source/drain regions 380 of the PFET. Similar to FIGS. 7A-7D, FIG. 8C is a perspective three-dimensional view of the FinFET devices 100, FIG. 8A is a cross-sectional view obtained using the Y-cut, and FIG. 8B is a cross-sectional view obtained using the X-cut, and FIG. 8D is a more magnified cross-sectional view of the PFET of FIG. 8A.

As shown in FIGS. 8A-8D, the source/drain regions 380 are grown on the exposed portions (e.g., the upper portions) of the fin structures 150A during the process 370. The source/drain regions 380 protrude upwards in the Z-direction and laterally in the Y-direction. In embodiments where the fin structures 150A comprise SiGe, the source/drain regions 380 for the PFET also comprise SiGe. As shown in FIG. 8D, remnants of the layers 200 and 230 may still remain formed on sidewalls of the lower portion of the fin structures 150A, and portions of the source/drain regions 380 are formed above the remnants of the layers 200 and 230.

Since the NFET portion of the FinFET devices 100 is still covered by the layer 200, no source/drain regions are formed for the NFET yet. In other words, the epitaxial growth process 370 does not grow anything on the fin structures 150B for the NFET, since the fin structures 150B are still covered by the layers 200 and 230. In certain conventional schemes, the source/drain regions for the PFET and NFET are grown at the same time, and as such the SiGe-containing source/drain may be grown for the NFET, and/or a Si-containing source/drain may be grown for the PFET. This is undesirable and may be referred to as epi-selectivity loss. In comparison, the layer 200 herein allows the source/drain regions for the PFET to be formed separately from the source/drain regions for the NFET. Consequently, the source/drain regions 380 formed for the PFET comprise SiGe but will be substantially free of Si, and the source/drain regions formed for the NFET (in a subsequent process discussed below) will comprise Si but will be substantially free of SiGe. As such, the processes of the present disclosure provide epi-selectivity loss immunity.

Figure 9A:
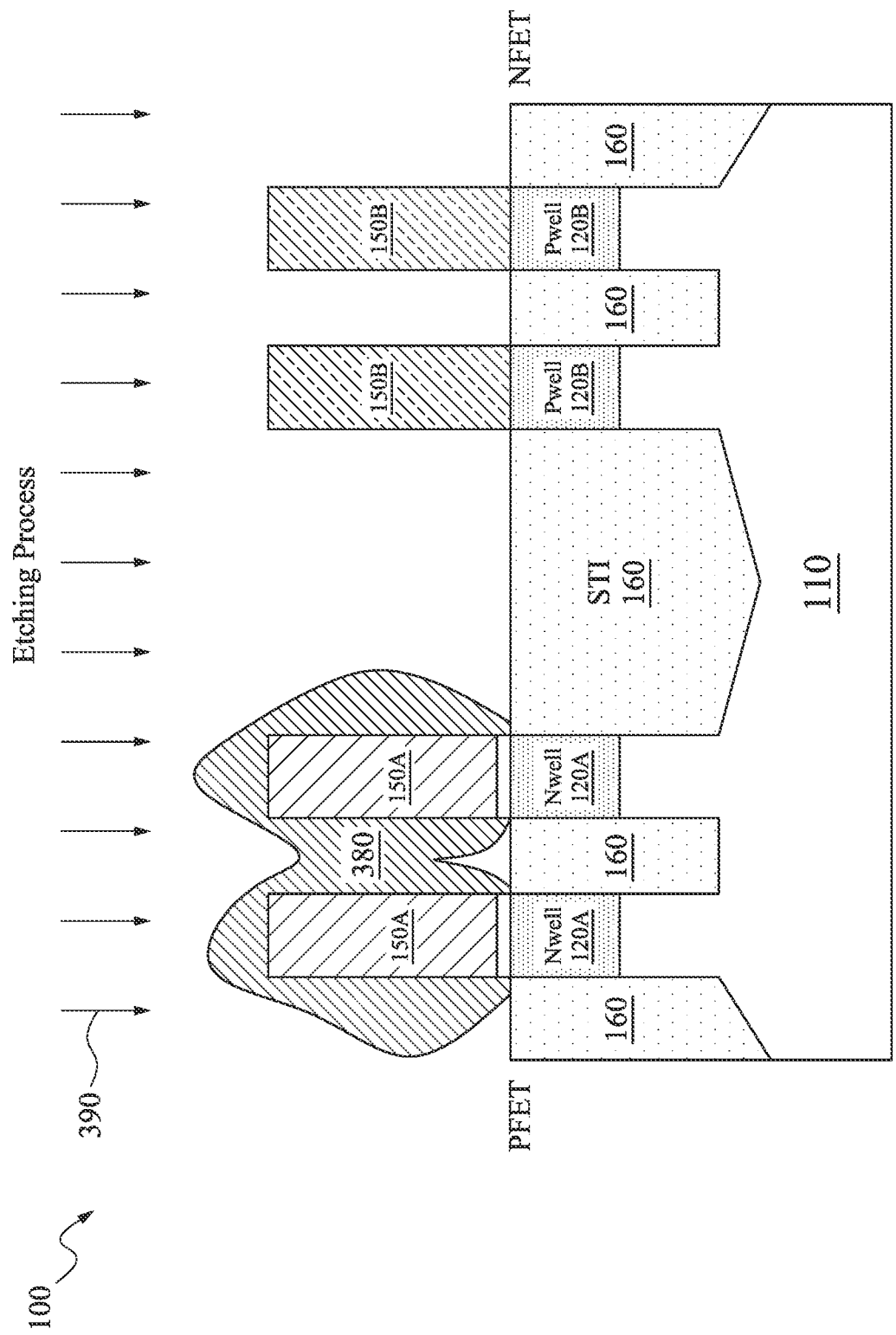

Referring now to FIG. 9A, the layer 200 is removed for the NFET. In some embodiments, the removal of the layer 200 may be performed using an etching process 390 that is similar to the etching process 350. As discussed above, since there is etching selectivity between the layer 200 and the dielectric layer 230, the removal of the layer 200 by etching does not substantially remove the dielectric layer 230. After the removal of the layer 200, the fin structures 150B are exposed. One reason for removing the layer 200 here is for process control stability. It helps stabilize process control to remove the layer 200 and then redeposit the layer (as will be done with reference to FIGS. 10A-10B discussed below) for the next round of patterning.

Figure 10B:
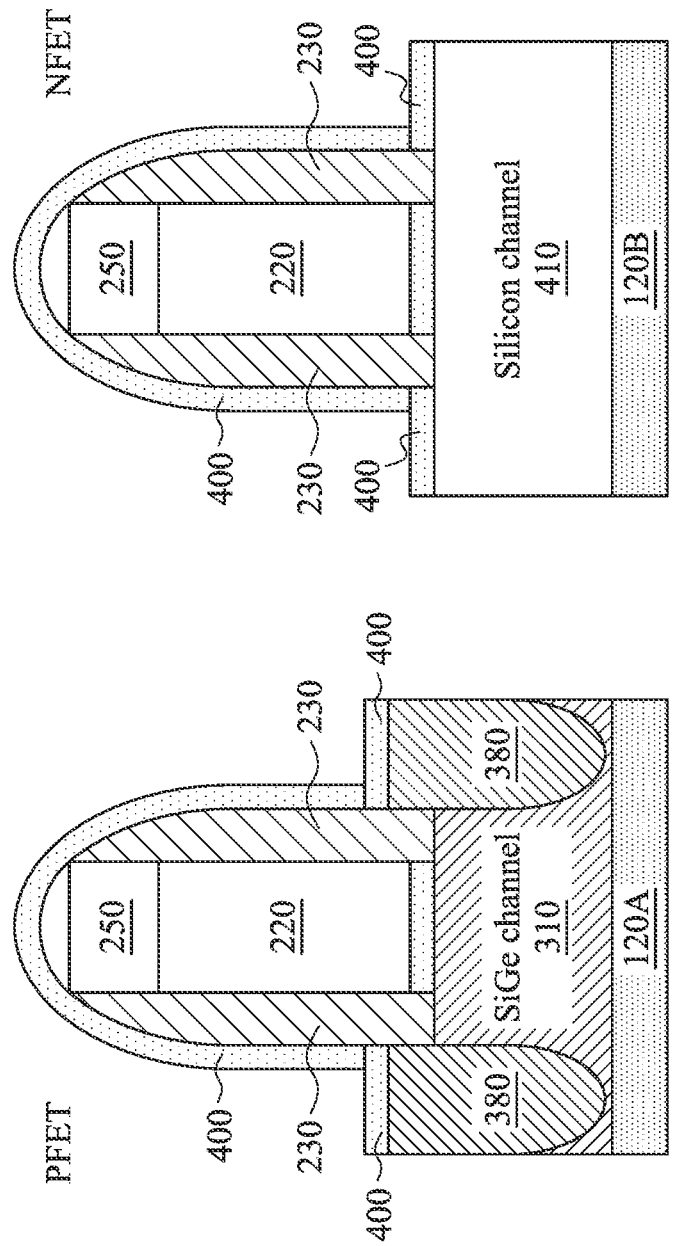

Referring now to FIGS. 10A and 10B, a layer 400 is formed over the side and top surfaces of the fin structures 150B for the NFET and over the side and top surfaces of the source/drain regions 380 for the PFET. The layer 400 is also formed over an upper surface of the isolation structures 160. In some embodiments, the formation of the layer 400 involves a conformal deposition process. In some embodiments, the layer 400 and the layer 200 have the same material composition. For example, the layer 400 may also include a dielectric layer, for example a metal-containing dielectric layer. In some embodiments, the layer 400 includes aluminum oxide ($Al_2O_3$). It is understood that the layer 400 will serve substantially the same functionalities as the layer 200 discussed above. In other words, it may be said that the formation of the layer 400 is equivalent to re-depositing the layer 200.

Note that FIG. 10B is obtained by taking the X-cut at two different portions of the FinFET devices 100. The PFET shown in FIG. 10B is obtained by taking the X-cut across one of the fin structures 150A, and the NFET shown in FIG. 10B is obtained by taking the X-cut across one of the fin structures 150B. The NFET shown in FIG. 10B illustrates a silicon channel 410 for the NFET, where the silicon channel is a portion of the fin structure 150B for the NFET. Pwells 120B are located below the silicon channel 410.

Figure 11A:
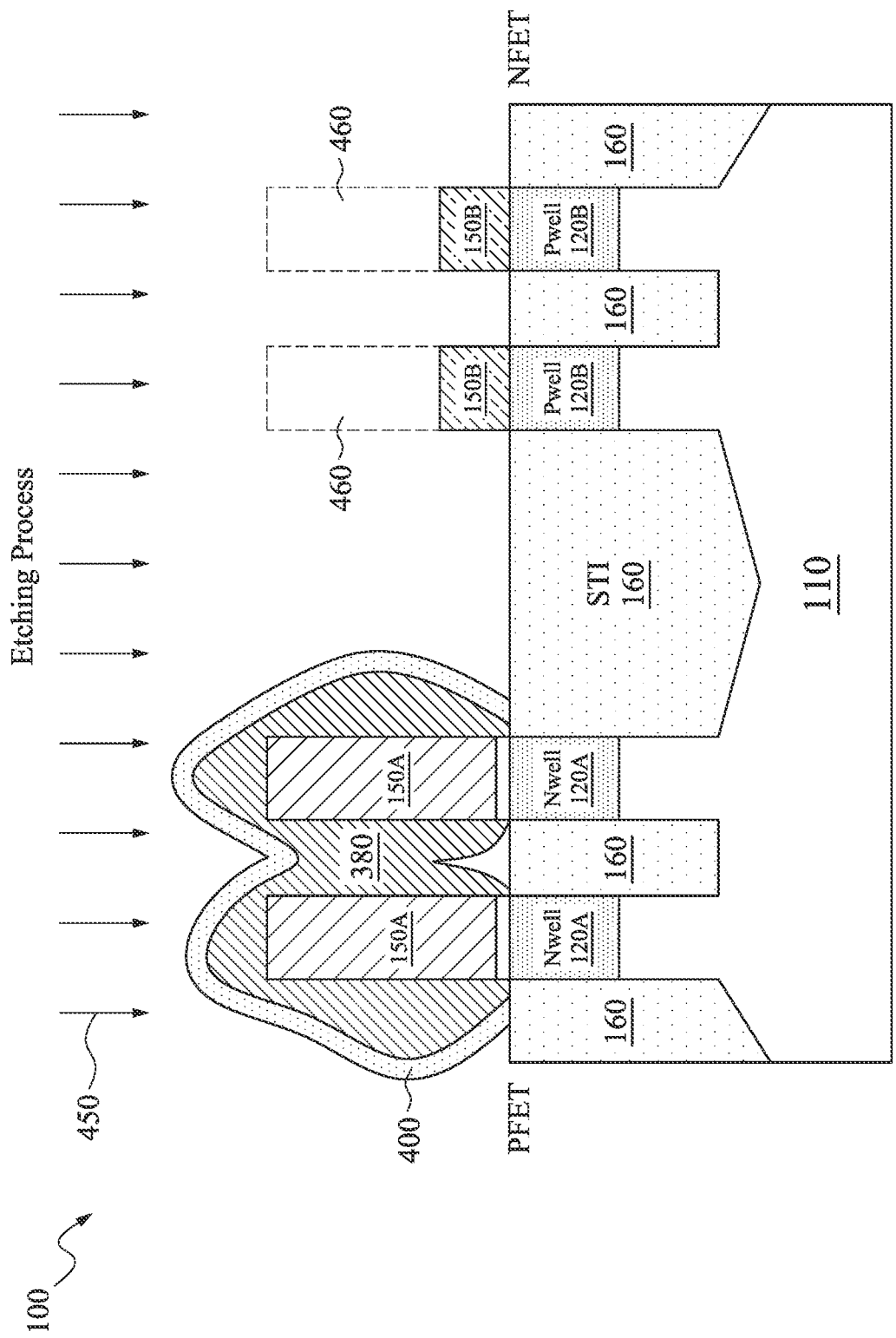
Figure 11B:
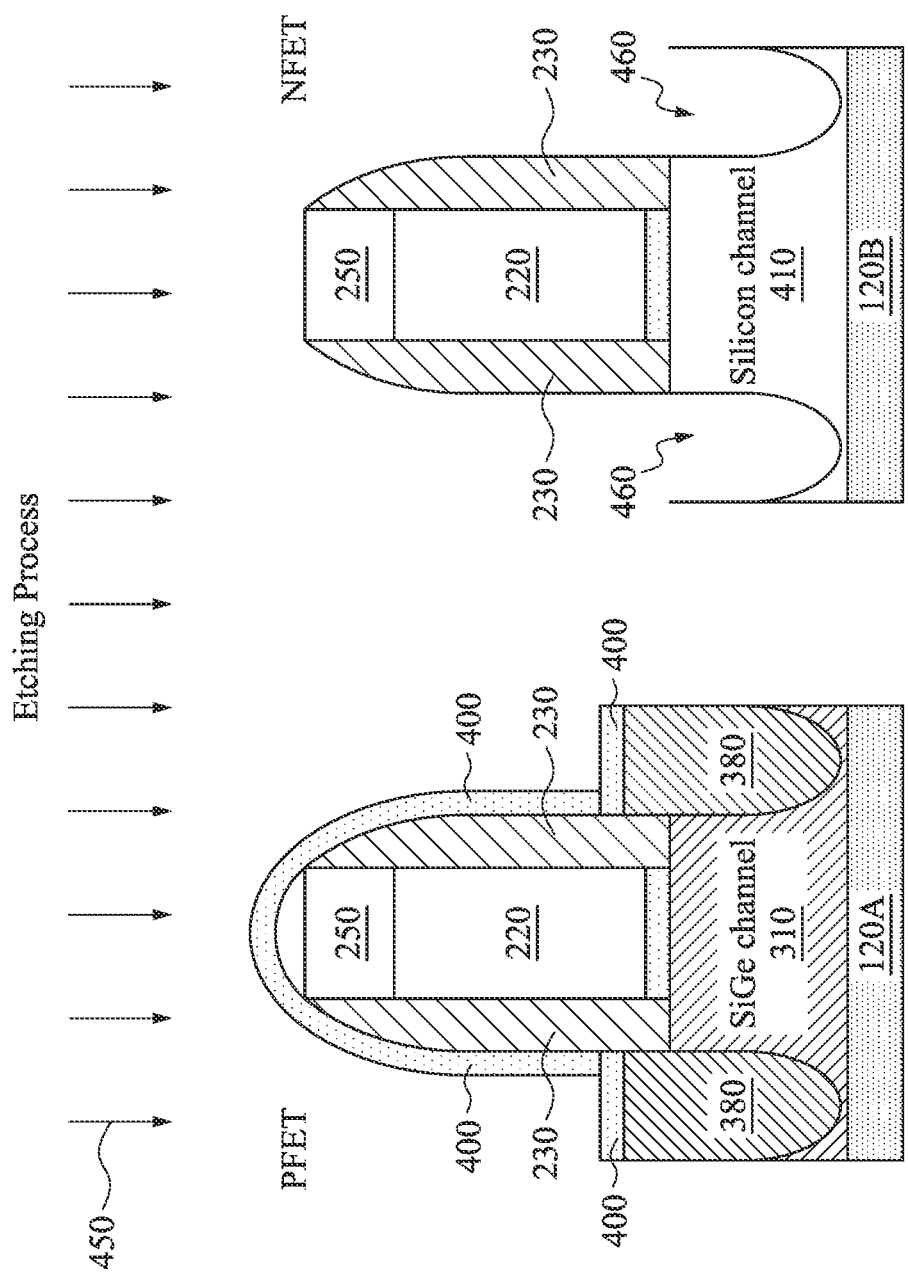
Figure 11C:
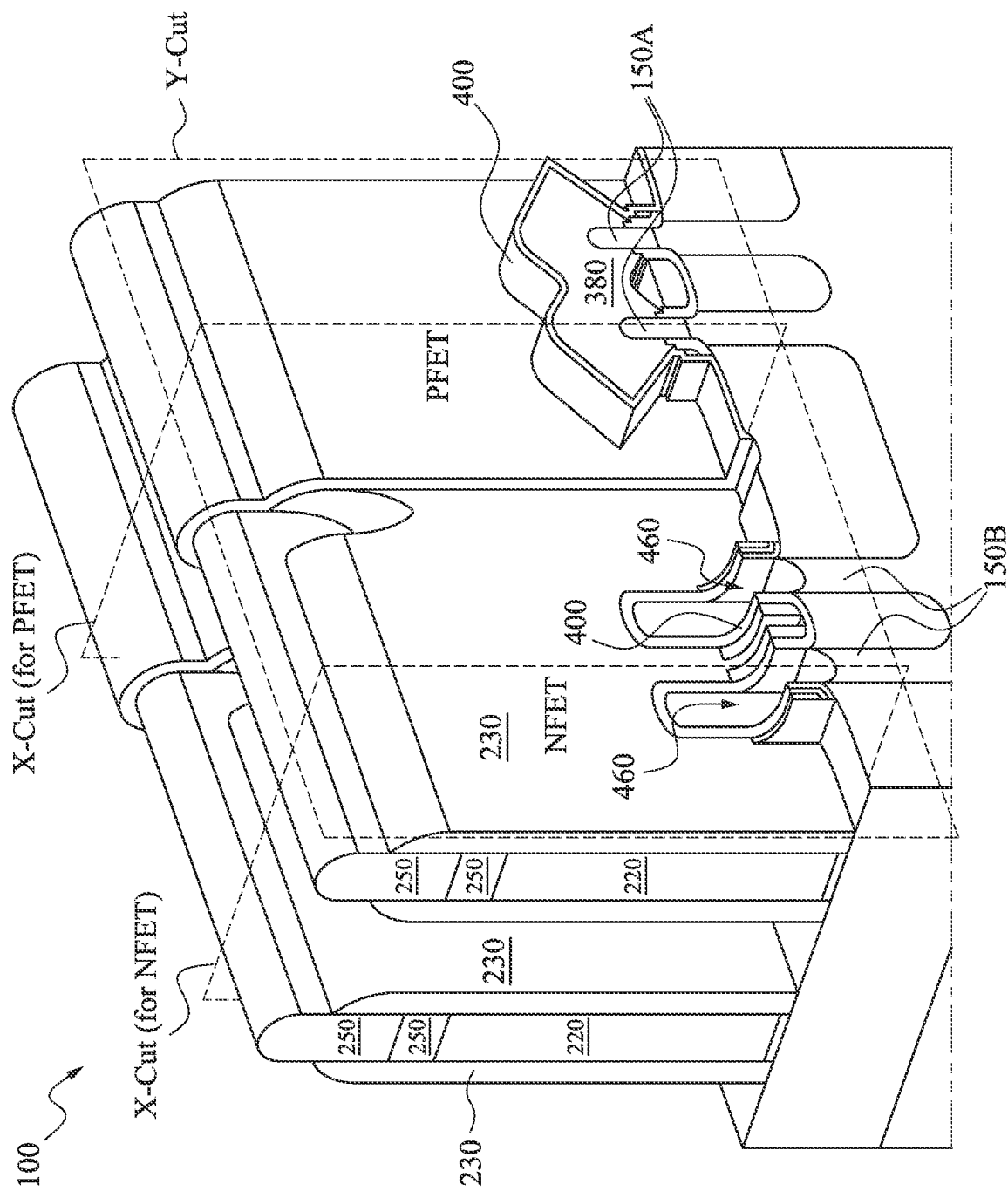
Figure 11D:
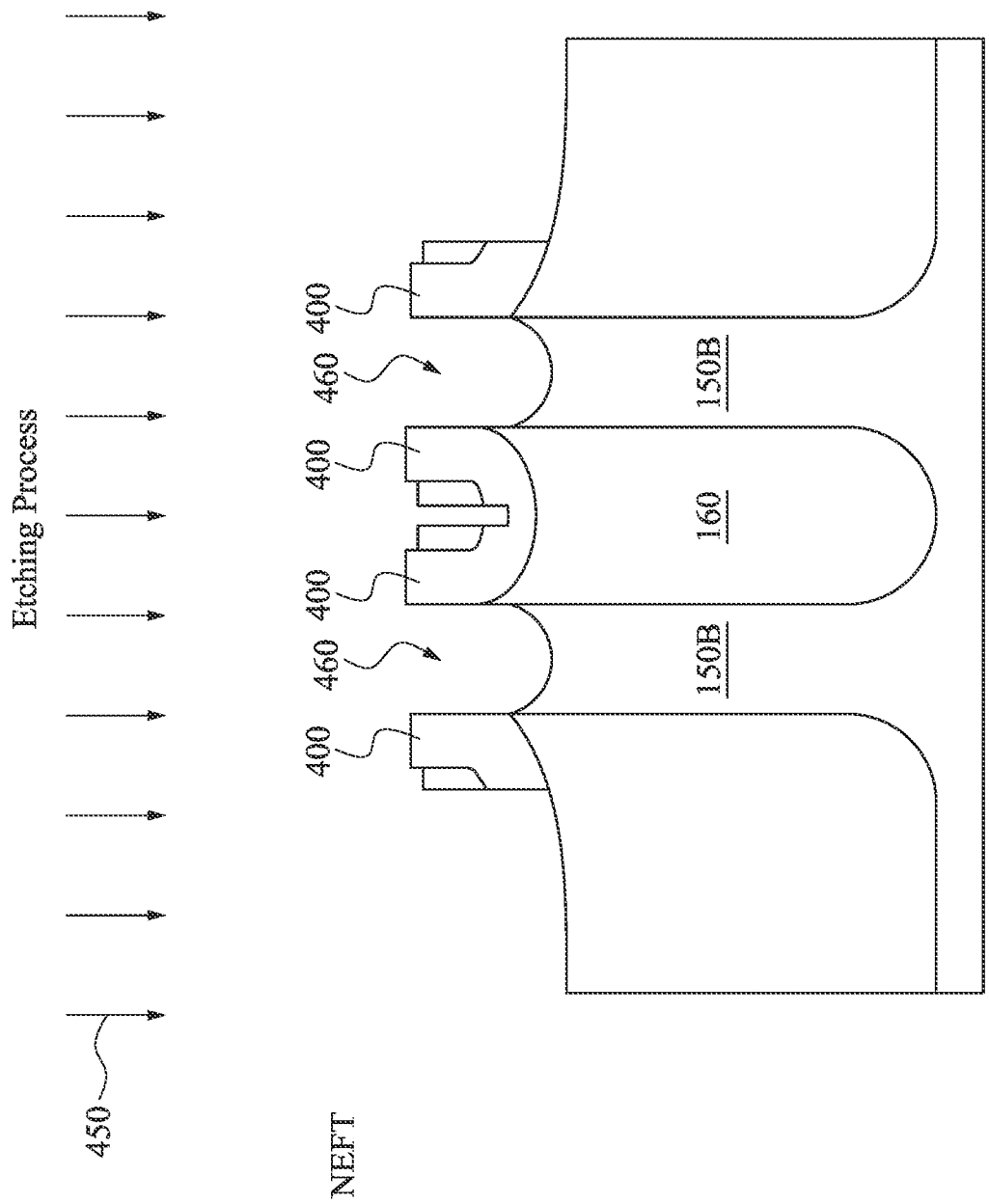

Referring now to FIGS. 11A, 11B, 11C, and 11D, the source/drain regions are defined for the NFET. FIG. 11C is a perspective three-dimensional view of the FinFET devices 100, FIG. 11A is a cross-sectional view obtained using the Y-cut, FIG. 11B is a cross-sectional view obtained using the X-cut at two different sections of the FinFET devices 100 (one X-cut at the PFET and another X-cut at the NFET). FIG. 11D is a more magnified cross-sectional view of the NFET of FIG. 11A.

The source/drain definition for the NFET is similar to the source/drain definition for the PFET (except the NFET and the PFET are switched) discussed above with reference to FIGS. 7A-7D. For example, as a part of the NFET source/drain definition, the PFET portion of the FinFET devices 100 may be covered up by a patterned photoresist layer (not specifically illustrated herein for reasons of simplicity). The NFET portion of the FinFET devices 100 is then exposed. An etching process similar to the etching process 300 discussed above is performed to the NFET portion of the FinFET devices 100 to remove portions of the dielectric layer 230 formed over the fin structures 150B. The layer 400 serves as an etching-stop layer during this etching process. Thereafter, an etching process similar to the etching process 350 discussed above is performed to remove portions of the layer 400 for the NFET but leaves the dielectric layer 230 intact, due to the etching selectivity between the layer 400 and the dielectric layer 230. The removal of the layer 400 exposes portions of the fin structures 150B for the NFET. Meanwhile, the source/drain regions 380 for the PFET are not exposed, since the layer 400 (which are not removed due to being protected by the patterned photoresist layer) is still disposed on the source/drain regions 380 for the PFET.

A recess etching process 450 is then performed to the FinFET devices 100 to etch recesses 460 in the NFET. As is shown in FIGS. 11B-11C, the recesses 460 are formed in the fin structures 150B, for example by etching away portions of the fin structures 150B. Thus, the recesses 460 are formed next to the silicon channel 410 of the NFET. FIGS. 11C and 11D also show portions of the layer 400 that still remain after the etching of the layer 400. These remaining portions of the layer 400 effectively further extend the recesses 460 upwards in the Z-direction.

Due to the Y-cut being taken at the recesses 460, the recesses 460 are not immediately or apparently visible in FIG. 11A, since the recesses 460 correspond to an absence of the fin structures 150B. To facilitate the understanding of the present disclosure, however, dashed lines are illustrated above the remaining segments of the fin structures 150B in FIG. 11A to represent the recesses 460 (i.e., the portions of the fin structures 150B that have been removed for the NFET).

Figure 12B:
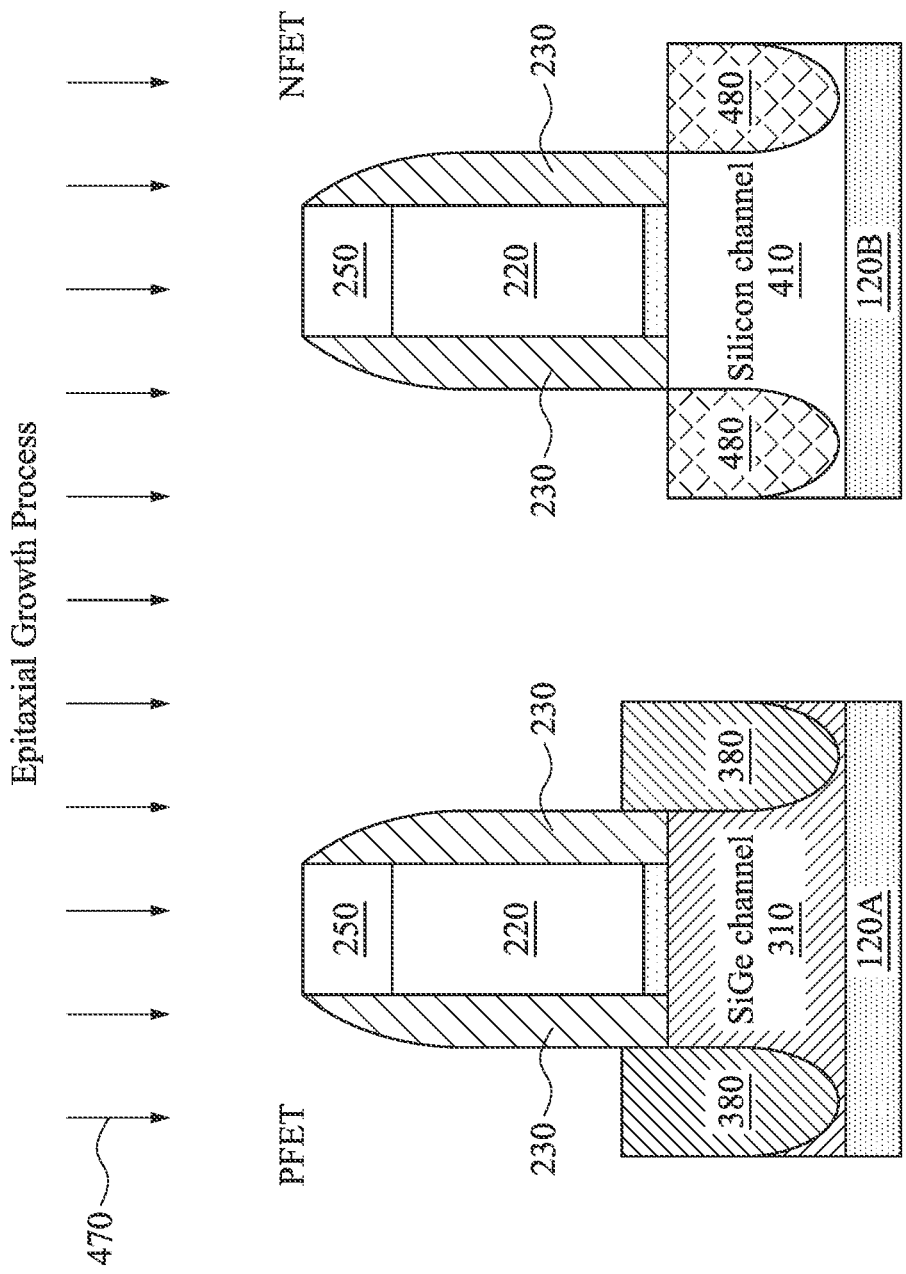
Figure 12C:
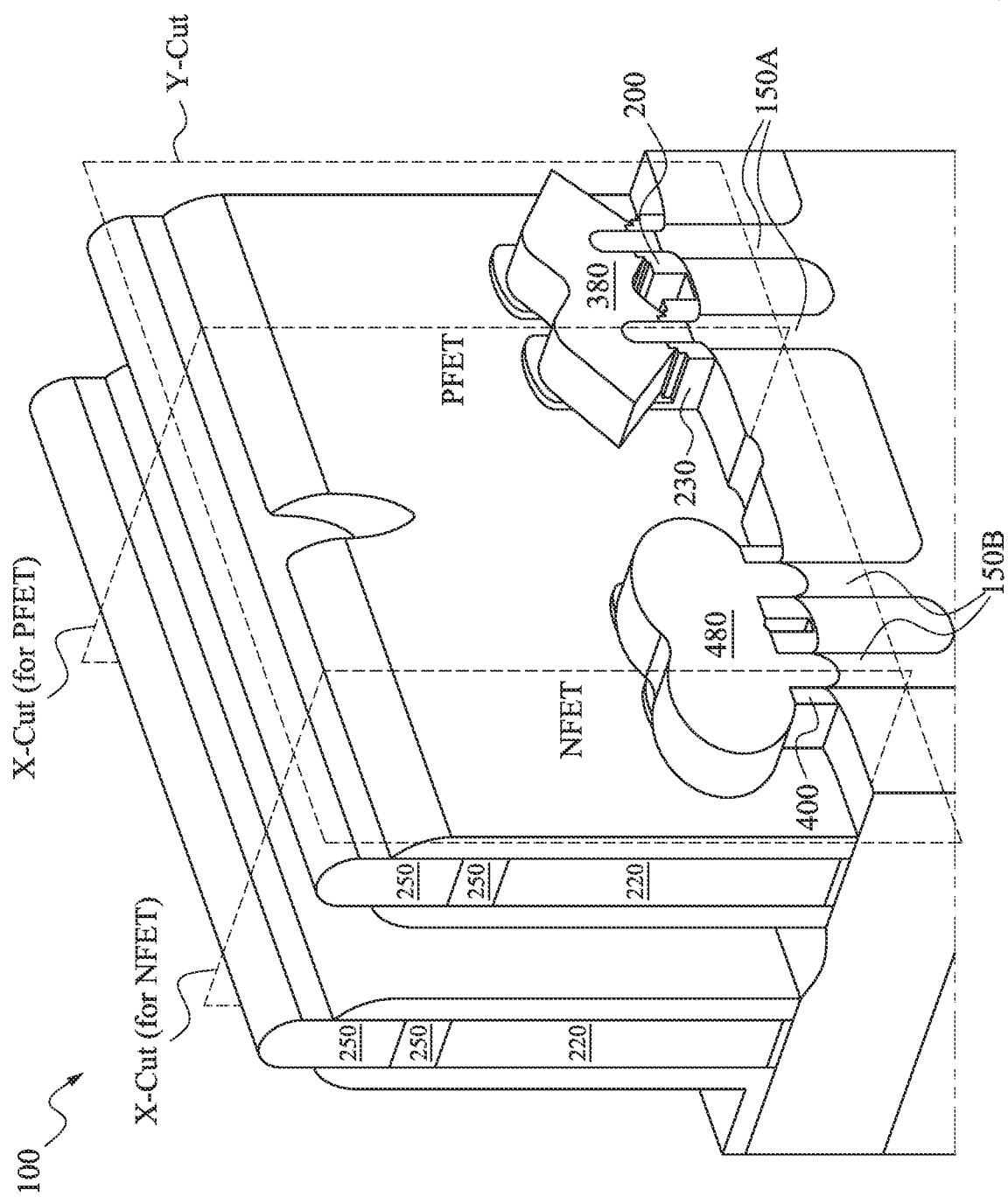

Referring now to FIGS. 12A, 12B, 12C, and 12D, an epitaxial growth process 470 is performed to epitaxially grow source/drain regions 480 of the NFET. The layer 400 is removed thereafter. Specifically, FIG. 12C is a perspective three-dimensional view of the FinFET devices 100, FIG. 12A is a cross-sectional view obtained using the Y-cut, FIG. 12B is a cross-sectional view obtained using the one X-cut for the PFET and another X-cut for the NFET, and FIG. 12D is a more magnified cross-sectional view of the NFET of FIG. 12A.

As shown in FIGS. 12A, 12C, and 12D, the source/drain regions 480 for the NFET are grown on the exposed portions of the fin structures 150B during the epitaxial growth process 470. The source/drain regions 480 fill the recesses 460 and protrude upwards out of the recesses 460 in the Z-direction and laterally in the Y-direction. In embodiments where the fin structures 150B comprise Si, the source/drain regions 480 also comprise Si. As discussed above, the PFET source/drain regions 380 had already been formed before the formation of the NFET source/drain regions 480. The separate formation of the PFET and NFET source/drain region—which is made possible by the unique process flow of the present disclosure—allows for higher quality epi-growth of the source/drain regions of the FinFET devices 100. Also as shown in FIG. 12D, since the removal of the layers 400 and 230 may not be 100%, remnants of the layers 400 and 230 may remain formed below the source/drain regions 480. The layers 400 and 230 may also be disposed on the sidewalls of the lower portions of the source/drain regions 480.

Note that in the stage of fabrication shown in FIG. 12C, the dielectric layers 230 (but not the layers 400) are still disposed on the sidewalls of the gate electrode stacks 220. These dielectric layers 230 will be removed in a subsequent process, and a low-k dielectric material will be deposited as the sidewall spacer for the gate electrode stacks 220. In addition, since the removal of the layers 200, 400, 230 may not be 100%, there may be residual portions of the layers 200, 400 and/or the dielectric layer 230 underneath the epitaxially-grown source/drain regions 380 and 480, for example as shown in FIG. 12C. Note that in some embodiments (such as in the embodiment shown in FIGS. 12A-12D), one of the NFET and PFET (e.g., NFET) comprises a recessed fin, while the other one of the NFET and PFET (e.g., PFET) comprises a non-recessed fin, over which a source/drain may be formed.

A plurality of other processes is performed to complete the fabrication of the FinFET devices 100. For example, a gate replacement process may be performed to replace the gate electrode stacks 220—which are dummy gate electrode stacks—with metal gate electrode stacks. For example, as a part of the gate replacement process, an interlayer dielectric (ILD) is formed over the isolation structures 160. The ILD may contain silicon oxide. A polishing process such as chemical-mechanical-polishing (CMP) is performed to planarize the upper surface of the ILD. The dummy gate electrode stacks 220 are then removed, and a metal gate electrode stack may be formed in place of each removed dummy gate electrode stack. In some embodiments, the metal gate electrode stack may include a work function metal component and a fill metal component. The work functional metal component is configured to tune a work function of its corresponding FinFET to achieve a desired threshold voltage Vt. In various embodiments, the work function metal component may contain: TiAl, TiAlN, TaCN, TiN, WN, or W, or combinations thereof. The fill metal component is configured to serve as the main conductive portion of the gate electrode. In various embodiments, the fill metal component may contain Aluminum (Al), Tungsten (W), Copper (Cu), or combinations thereof. It is also understood that a high-k gate dielectric may be formed beneath each metal gate electrode stack. A high-k dielectric material is a material having a dielectric constant that is greater than a dielectric constant of SiO2, which is approximately 4. In an embodiment, the high-k gate dielectric includes hafnium oxide (HfO2), which has a dielectric constant that is in a range from approximately 18 to approximately 40. In alternative embodiments, the high-k gate dielectric may include ZrO2, Y2O3, La2O5, Gd2O5, TiO2, Ta2O5, HfErO, HfLaO, HfYO, HfGdO, HfAlO, HfZrO, HfTiO, HfTaO, or SrTiO.

Figure 13C:
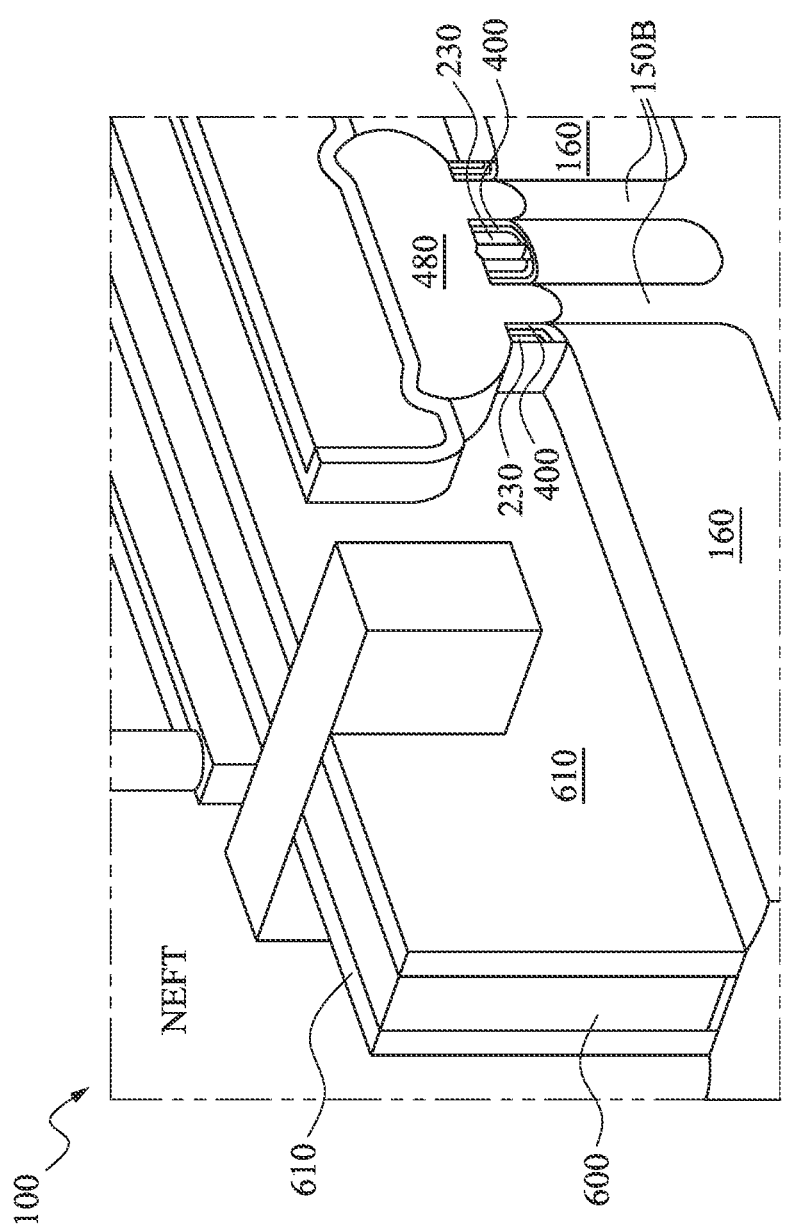
FIG. 13C is a perspective three-dimensional view of FinFET devices at a stage of fabrication according to embodiments of the present disclosure.

Referring now to FIG. 13C, a diagrammatic three-dimensional view of the FinFET devices 100 is illustrated after the gate replacement process discussed above has been performed. As shown in FIG. 13C, a gate stack 600 is formed to replace the dummy gate electrode stack 220. The gate stack 600 may include a high-k gate dielectric and a metal gate electrode as discussed above. An ILD 610 is formed on the sidewalls of the gate stack 600. The gate stack 600 and the ILD are formed over the isolation structure 160. The portion of the FinFET devices 100 shown in FIG. 13C is an NFET, and thus fin structures 150B and epitaxially-grown source/drain regions 480 are formed.

As discussed above, due to process window limitations, some residue of the layers 400 and 230 may still remain formed on the sidewalls of a lower portion of the source/drain region 480 (and below an upper portion of the source/drain region 480). Similarly, some residue of the layers 200 and 230 may remain formed on the sidewalls of a lower portion of the fin structures 150A for a PFET (such as illustrated in FIGS. 8D and 12D), but the PFET is not illustrated in FIG. 13C for reasons of simplicity.

It is understood that the presence of the layers 230 and 200/400 at this stage of fabrication (i.e., after the gate replacement) is not intentional, nor do these layers serve important functions at this point, since the residue of these layers is mostly attributed to process imperfections. Nevertheless, the presence of these layers 230 and 200/400 at this stage of fabrication is evidence that the unique process flows discussed above have been performed. In other words, if the final FinFET device from a given manufacturer is found to contain remnants of the layers 230 and 200/400 in the locations discussed above with reference to FIGS. 8D, 12C-12D and 13C, it is likely that the final FinFET device was fabricated using the unique process flows of the present disclosure.

Figure 14:
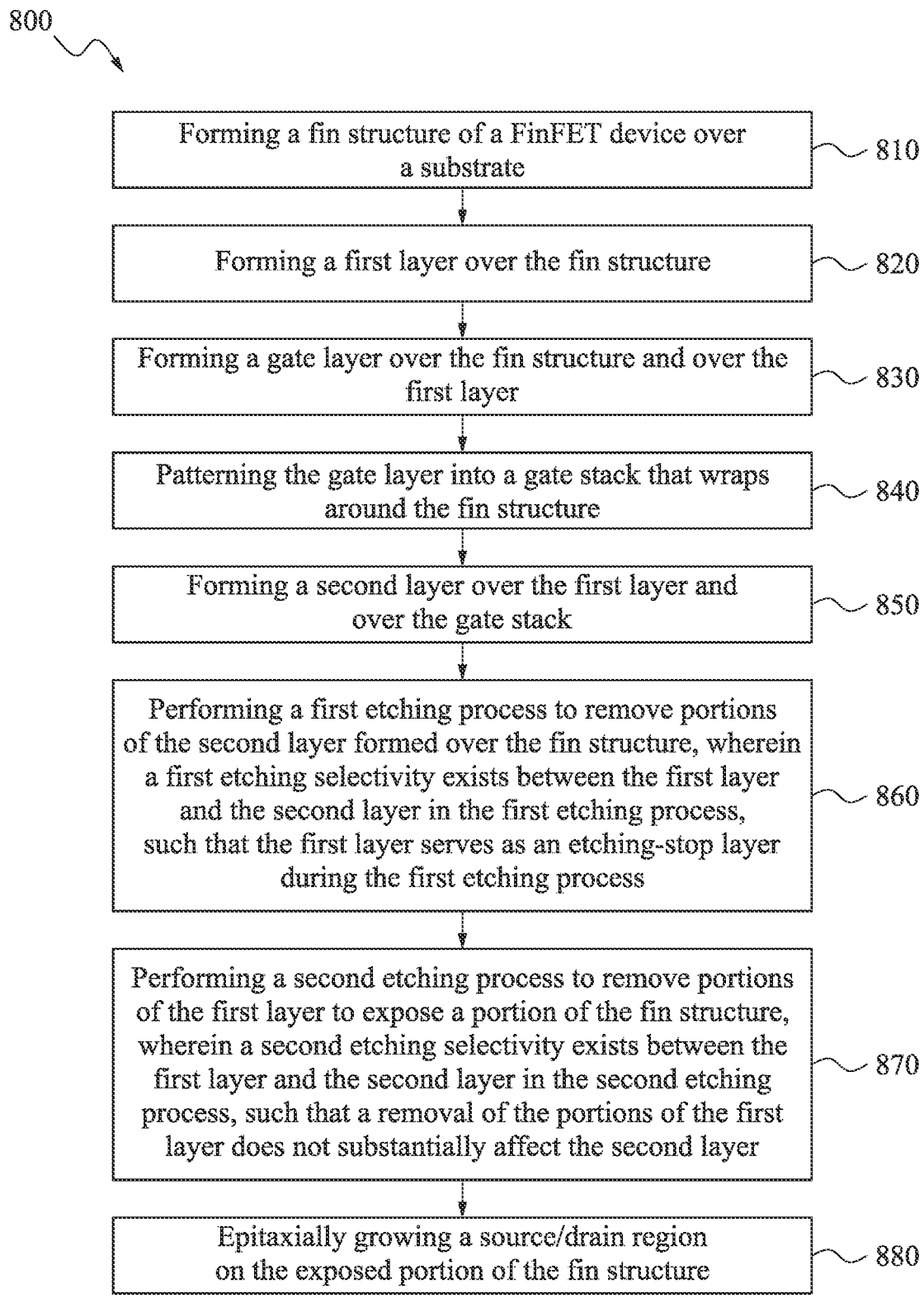
FIG. 14 is a flow chart illustrating a method of fabricating a FinFET device in accordance with embodiments of the present disclosure.

FIG. 14 is a flowchart of a method 800 for fabricating a FinFET device in accordance with various aspects of the present disclosure. The method 800 includes a step 810 of forming a fin structure of a FinFET device over a substrate.

The method 800 includes a step 820 of forming a first layer over the fin structure. In some embodiments, the forming the first layer comprises forming a metal-containing layer as the first layer. In some embodiments, the forming the metal-containing layer comprises forming an aluminum-oxide ($Al_2O_3$) layer with thickness between about 1 nm and about 10 nm and is deposited by a conformal CVD and/or ALD process as the first layer.

The method 800 includes a step 830 of forming a gate layer over the fin structure and over the first layer.

The method 800 includes a step 840 of patterning the gate layer into a gate stack that wraps around the fin structure.

The method 800 includes a step 850 of forming a second layer over the first layer and over the gate stack. In some embodiments, the forming the second layer comprises forming a layer that contains silicon nitride as the second layer.

The method 800 includes a step 860 of performing a first etching process to remove portions of the second layer formed over the fin structure. A first etching selectivity exists between the first layer and the second layer in the first etching process, such that the first layer serves as an etching-stop layer during the first etching process. In some embodiments, the first etching process comprises a dry etching process.

The method 800 includes a step 870 performing a second etching process to remove portions of the first layer to expose a portion of the fin structure. A second etching selectivity exists between the first layer and the second layer in the second etching process, such that a removal of the portions of the first layer does not substantially affect the second layer. In some embodiments, the second etching process comprises a wet etching process.

The method 800 includes a step 880 of epitaxially growing a source/drain region on the exposed portion of the fin structure.

In some embodiments, the second etching process does not completely remove the first layer but still leaves remnants of the first layer on sidewalls of the fin structure. In some embodiments, the first etching process does not completely remove the second layer but still leaves remnants of the second layer on sidewalls of the first layer.

It is understood that additional process steps may be performed before, during, or after the steps 810-880 discussed above to complete the fabrication of the semiconductor device. For example, the gate stack may comprise a dummy gate electrode, and the method 800 may further include a step of: replacing the dummy gate electrode with a metal gate electrode. In addition, the steps 860-880 are performed for a PFET of the FinFET device in some embodiments, in which case the method 800 may further repeat the steps 860-880 for an NFET of the FinFET device. As another example, the method 800 may include a step of removing the first layer and re-depositing the first layer after the source/drain region of the NFET has been epitaxially grown but before the repeating. Other process steps are not discussed herein for reasons of simplicity.

Based on the above discussions, it can be seen that the present disclosure offers advantages over conventional FinFET and the fabrication thereof. It is understood, however, that other embodiments may offer additional advantages, and not all advantages are necessarily disclosed herein, and that no particular advantage is required for all embodiments. One advantage is that the formation of the metal-containing layer (e.g., an aluminum oxide layer) allows it to serve as an etching stop layer for the dielectric layer (e.g., a silicon nitride layer) formed thereover, due to the good etching selectivity between these two layers. Another advantage is that the metal-containing layer can be easily removed in a wet etching process, which makes it suitable for patterning. Yet another advantage is that the unique process flows discussed can reduce epi-selectivity loss during the formation of the source/drain regions of the PFET and the NFET. Yet another advantage of the present disclosure is that the unique fabrication steps discussed herein are easy to implement and are compatible with existing fabrication process flow. Therefore, implementing the present disclosure does not lead to increased costs.

One aspect of the present disclosure involves a method of fabricating a semiconductor device. A fin structure of a FinFET device is formed over a substrate. A first layer is formed over the fin structure. A gate layer is formed over the fin structure and over the first layer. The gate layer is patterned into a gate stack that wraps around the fin structure. A second layer is formed over the first layer and over the gate stack. A first etching process is performed to remove portions of the second layer formed over the fin structure. A first etching selectivity exists between the first layer and the second layer in the first etching process, such that the first layer serves as an etching-stop layer during the first etching process. A second etching process is performed to remove portions of the first layer to expose a portion of the fin structure. A second etching selectivity exists between the first layer and the second layer in the second etching process, such that a removal of the portions of the first layer does not substantially affect the second layer. A source/drain region is epitaxially grown on the exposed portion of the fin structure.

Another aspect of the present disclosure involves a semiconductor device. The semiconductor device includes a fin structure that protrudes out of a substrate. A source/drain region is disposed on a sidewall of an upper portion of the fin structure. A metal-containing material is disposed on a sidewall of a lower portion of the fin structure.

Yet another aspect of the present disclosure involves a semiconductor device. The semiconductor device includes a fin structure that protrudes out of a substrate. An upper portion of the fin structure includes a recess. A source/drain region is disposed over the fin structure. The source/drain region fills the recess. A metal-containing material is disposed on a sidewall of a lower portion of the source/drain region. The metal-containing material is disposed below an upper portion of the source/drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first fin structure and a second fin structure that each protrude vertically out of a substrate;
a dielectric isolation structure disposed between the first fin structure and the second fin structure;
a source/drain component disposed over the first fin structure, the second fin structure, and the dielectric isolation structure; and
a metal-containing material disposed between the source/drain component and the dielectric isolation structure.

2. The semiconductor device of claim 1, wherein the metal-containing material includes a dielectric material that contains a metal element.

3. The semiconductor device of claim 1, wherein the metal-containing material contains aluminum oxide.

4. The semiconductor device of claim 1, further comprising a dielectric material disposed between the source/drain component and the metal-containing material, wherein the dielectric material and the metal-containing material have different material compositions.

5. The semiconductor device of claim 4, wherein the dielectric material contains silicon nitride.

6. The semiconductor device of claim 4, wherein the dielectric material is disposed below, and free of being in physical contact with, the source/drain component.

7. The semiconductor device of claim 4, wherein the dielectric material is disposed below, and in physical contact with, the source/drain component.

8. The semiconductor device of claim 1, wherein a bottom surface of the metal-containing material is in direct physical contact with an upper surface of the dielectric isolation structure.

9. The semiconductor device of claim 1, wherein:
the first fin structure, the second fin structure, and the source/drain component are components of a p-type transistor; and
the source/drain component partially wrap around the first fin structure and the second fin structure.

10. The semiconductor device of claim 9, wherein a portion of the metal-containing material is in direct physical contact with the first fin structure or with the second fin structure.

11. The semiconductor device of claim 1, wherein:
the first fin structure, the second fin structure, and the source/drain component are components of an n-type transistor; and
the source/drain component is in direct contact with upper surfaces of first fin structure and the second fin structure but not with side surfaces of the first fin structure and the second fin structure.

12. The semiconductor device of claim 11, wherein the upper surfaces of the first fin structure and the second fin structure are recessed downwardly.

13. The semiconductor device of claim 11, wherein the side surfaces of the first fin structure and the second fin structure are in direct physical contact with the dielectric isolation structure but not with the metal-containing material.

14. A semiconductor device, comprising:
a first fin structure and a second fin structure that each protrude vertically out of a substrate;
a dielectric isolation structure located between the first fin structure and the second fin structure;
a source/drain component located over the first fin structure, the second fin structure, and the dielectric isolation structure;
a first dielectric material located over the dielectric isolation structure, wherein the first dielectric material contains a metal element; and
a second dielectric material located between the first dielectric material and the source/drain component, wherein the first dielectric material and the second dielectric material have different material compositions.

15. The semiconductor device of claim 14, wherein:
the first fin structure, the second fin structure, and the source/drain component are components of a p-type transistor; and
the source/drain component is in direct physical contact with portions of side surfaces of the first fin structure and portions of side surfaces of the second fin structure.

16. The semiconductor device of claim 14, wherein:
the first fin structure, the second fin structure, and the source/drain component are components of an n-type transistor; and
the source/drain component is in direct physical contact with portions of side surfaces of the first dielectric material.

17. The semiconductor device of claim 16, wherein an upper surface of each of the first fin structure and the second fin structure is downwardly recessed.

18. A semiconductor device, comprising:
a p-type transistor that includes:
- a first fin structure and a second fin structure that protrude vertically out of a substrate;
- a first source/drain component formed over the first fin structure and the second fin structure;
- a first metal-containing layer formed between the first fin structure and the second fin structure and below the first source/drain component; and a n-type transistor that includes:
- a third fin structure and a fourth fin structure that protrude vertically out of the substrate;
- a second source/drain component formed over the third fin structure and the fourth fin structure;
- a second metal-containing layer formed below the second source/drain component;

wherein:
the first source/drain component and the second source/drain component are shaped differently from each other; and
the first metal-containing layer and the second metal-containing layer are shaped differently from each other.

19. The semiconductor device of claim 18, further comprising:
- a first dielectric material disposed between the first source/drain component and the first metal-containing layer; and
- a second dielectric material disposed between the second source/drain component and the second metal-containing layer, wherein the second dielectric material is shaped differently from the second dielectric material.

20. The semiconductor device of claim 18, wherein:

the first metal-containing layer is in direct contact with a side surface of the first fin structure or a side surface of the second fin structure; and the second metal-containing layer is in direct contact with a side surface of the second source/drain component.

* * * * *